United States Patent
Liu et al.

(10) Patent No.: US 10,867,971 B2
(45) Date of Patent: Dec. 15, 2020

(54) LIGHT EMITTING DIODE PANEL

(71) Applicant: Au Optronics Corporation, Hsinchu (TW)

(72) Inventors: Chung-Chan Liu, Hsinchu (TW); Pin-Miao Liu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 54 days.

(21) Appl. No.: 16/449,440

(22) Filed: Jun. 23, 2019

(65) Prior Publication Data

US 2020/0194406 A1 Jun. 18, 2020

(30) Foreign Application Priority Data

Dec. 12, 2018 (TW) .............................. 107144885 A

(51) Int. Cl.
*H01L 25/075* (2006.01)
*H01L 33/62* (2010.01)
*H01L 23/00* (2006.01)

(52) U.S. Cl.
CPC .......... *H01L 25/0753* (2013.01); *H01L 24/10* (2013.01); *H01L 33/62* (2013.01); *H01L 24/85* (2013.01)

(58) Field of Classification Search
CPC ..... H01L 25/0753; H01L 24/85; H01L 24/10; H01L 33/62
See application file for complete search history.

(56) References Cited

U.S. PATENT DOCUMENTS

| | | | |
|---|---|---|---|
| 7,764,330 B2 | 7/2010 | Kawamura et al. | |
| 8,289,464 B2 | 10/2012 | Kawamura et al. | |
| 9,508,300 B2 * | 11/2016 | Choi | ....................... H01L 28/60 |
| 10,043,788 B1 | 8/2018 | Han | |
| 10,497,756 B1 * | 12/2019 | Chen | ..................... H01L 25/167 |
| 2002/0071082 A1 * | 6/2002 | Okita | .................. H01L 27/3288 |
| | | | 349/145 |

(Continued)

FOREIGN PATENT DOCUMENTS

| | | |
|---|---|---|
| CN | 101582252 | 8/2011 |
| CN | 101059636 | 9/2011 |

(Continued)

*Primary Examiner* — Christine A Enad
(74) *Attorney, Agent, or Firm* — JCIPRNET

(57) ABSTRACT

A light emitting diode panel including a first connecting wire, a first driving connection wire, a second driving connection wire, a first light emitting device, a second light emitting device and a spare electrode is provided. The driving signal transmitted by the first driving connection wire is independent of the driving signal transmitted by the second driving connection wire. The first light emitting device is connected to the first connecting wire and the first driving connection wire. The second light emitting device is connected to the first connecting wire and the second driving connection wire. The spare electrode is positioned between the first driving connection wire and the second driving connection wire. The spare electrode includes a first part and two second parts. The first part is positioned between two second parts. The first part extends in a first direction and each of the second parts extends in a second direction. An imaginary line extending from the first part along the first direction crosses over two second parts.

25 Claims, 17 Drawing Sheets

(56) References Cited

U.S. PATENT DOCUMENTS

| | | |
|---|---|---|
| 2008/0036936 A1 | 2/2008 | Kawamura et al. |
| 2010/0214205 A1 | 8/2010 | Kawamura et al. |
| 2015/0062484 A1* | 3/2015 | Lee .................. G02B 6/0073 349/61 |
| 2016/0351092 A1 | 12/2016 | Chen et al. |
| 2018/0226388 A1 | 8/2018 | Han |

FOREIGN PATENT DOCUMENTS

| | | |
|---|---|---|
| CN | 105023522 | 11/2015 |
| CN | 106684098 | 5/2017 |

* cited by examiner

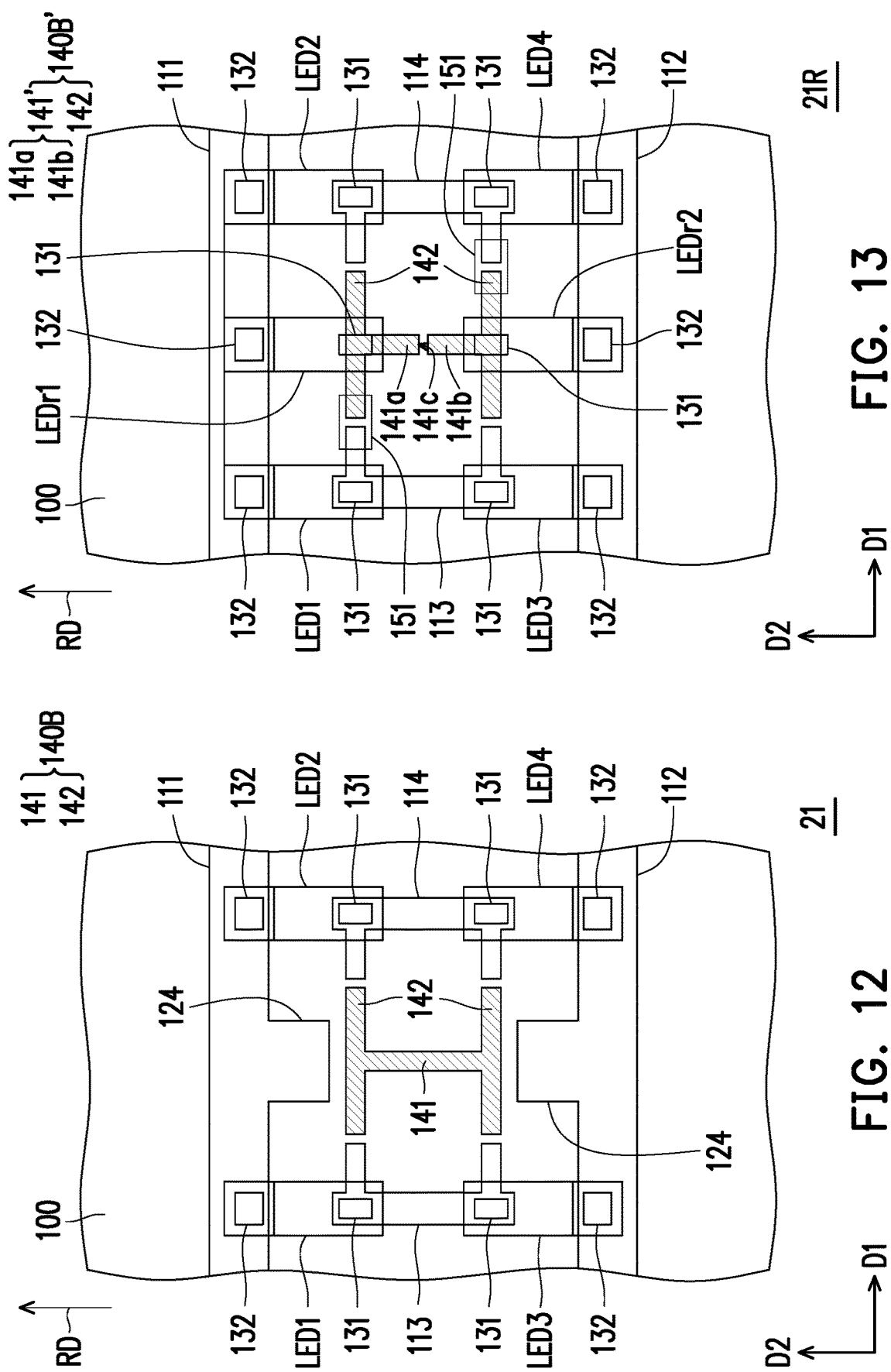

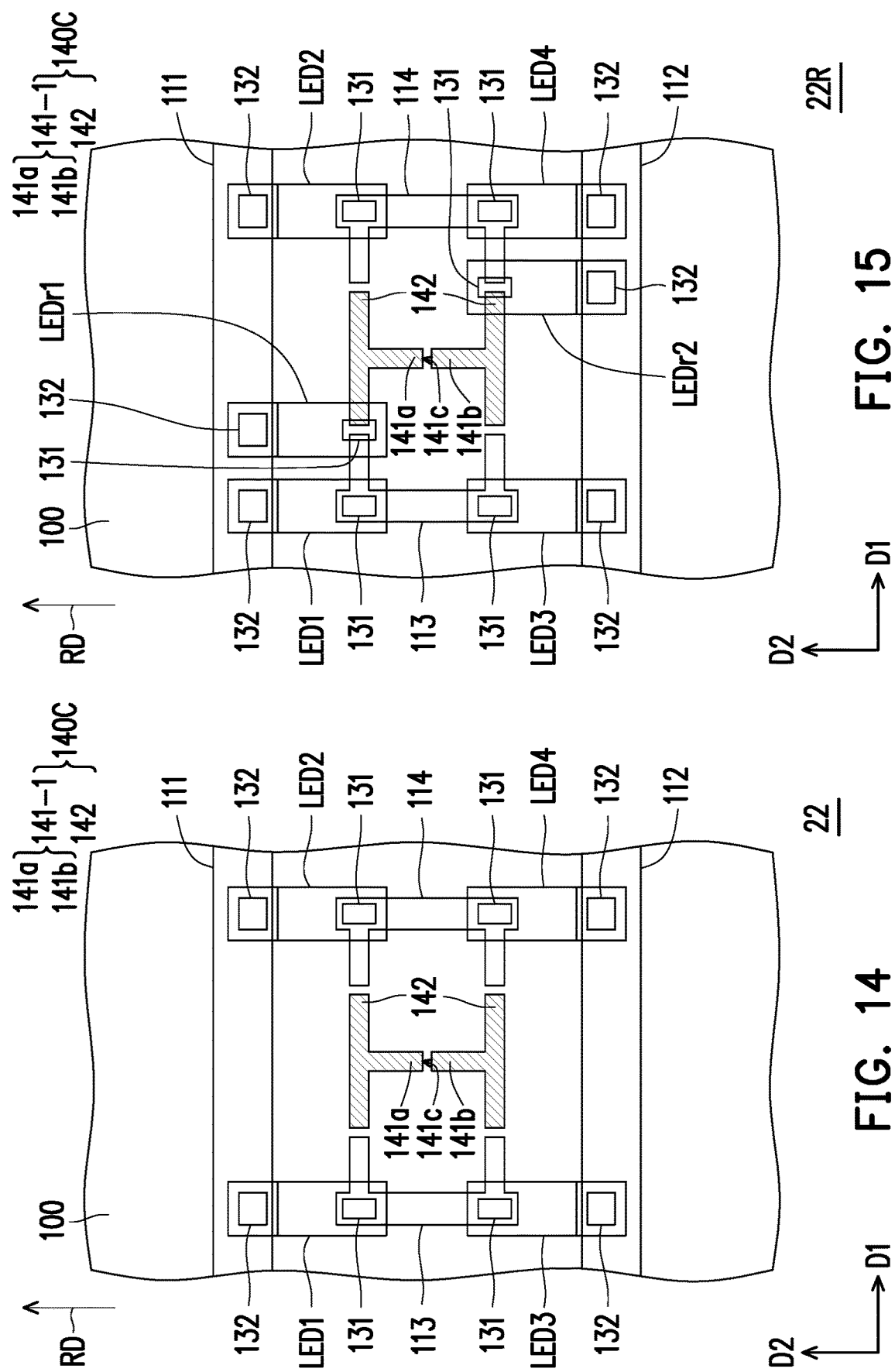

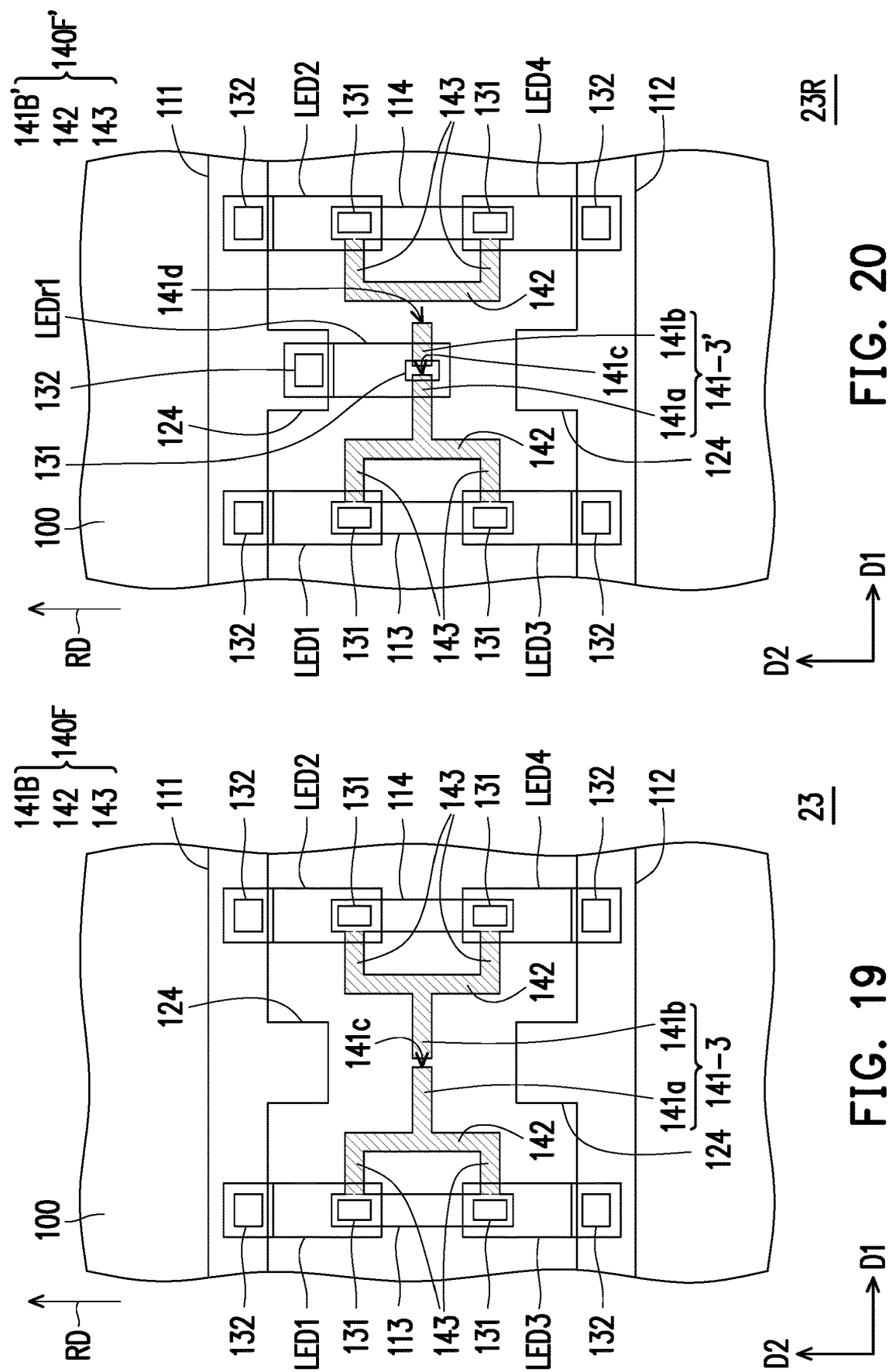

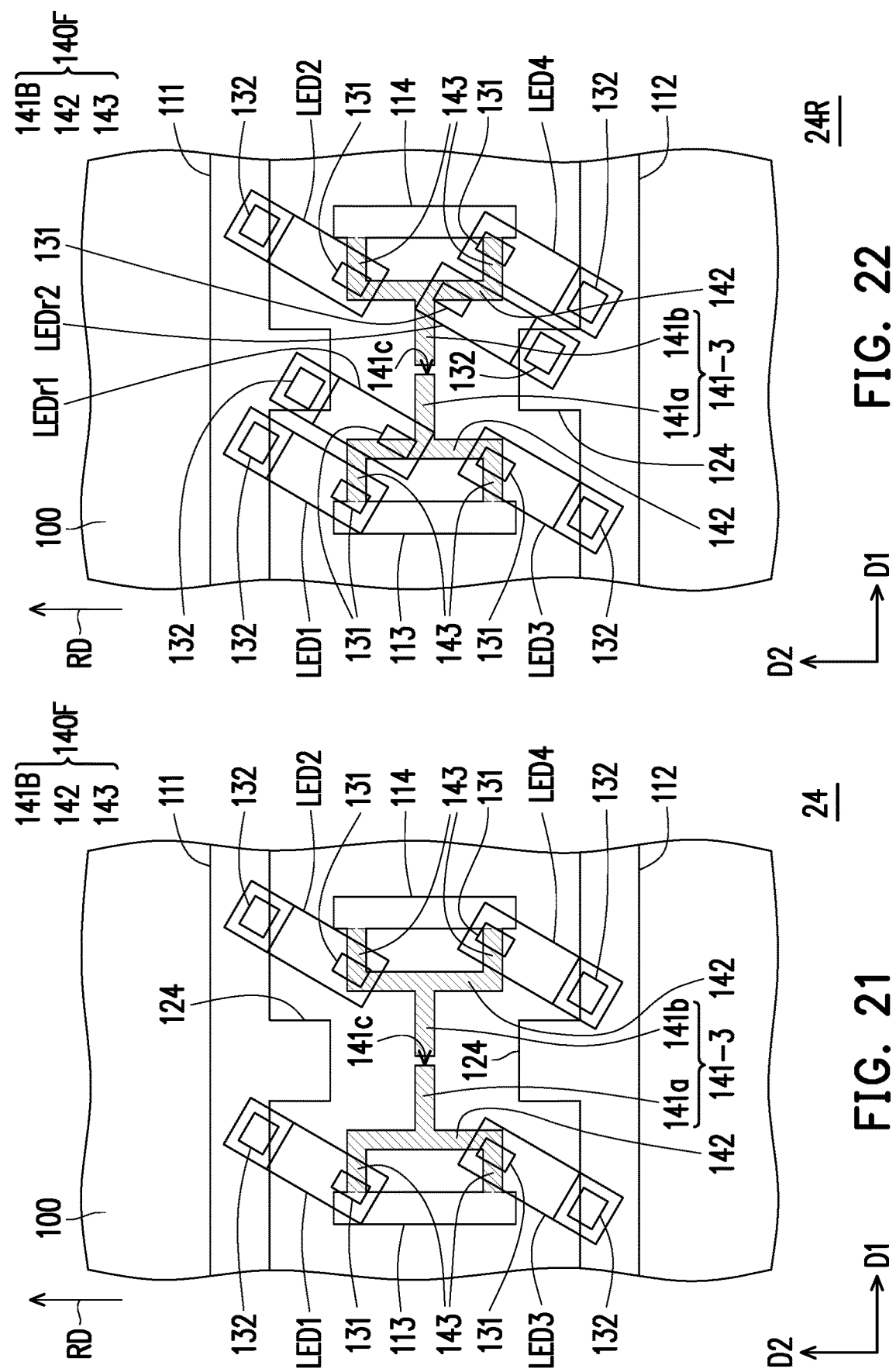

LIGHT EMITTING DIODE PANEL

CROSS-REFERENCE TO RELATED APPLICATION

This application claims the priority benefit of Taiwan application serial no. 107144885, filed on Dec. 12, 2018. The entirety of the above-mentioned patent application is hereby incorporated by reference herein and made a part of this specification.

BACKGROUND

Technical Field

The present invention relates to a light emitting diode (LED) panel. More particularly, the present invention relates to an LED panel with a high process yield.

Description of Related Art

In recent years, an organic light emitting diode (OLED) panel has become a marketplace of the mobile devices and even large-size TV due to its advantages of power saving, light weight, high efficiency, high contrast and fast response time. However, to compare with the current mainstream liquid crystal display (LCD) panels, the organic LED panel has shortcomings such as short lifetime of the luminescent material, poor reliability under long-life operation, and high production cost. Therefore, to compare with the organic LED panel, the micro-LEDs panel with the advantages of color easier correction, long luminescence lifetime, and no image sticking is gradually favored, and it is expected to become the display technology of the next generation.

In order to reduce the production costs, the development of mass transfer technology has become the key to develop the micro-LEDs display technology. However, the current transfer technology is not easy to improve due to the die transfer success rate so as to affect the production yield of the micro-LEDs panel. Therefore, while improving the transfer technology, how to improve the production yield of micro-LEDs panel is also a problem that various technology factories are trying to solve.

SUMMARY

The present invention provides an LED panel with a high process yield.

The LED panel of the present invention includes a first connecting wire, a first driving connection wire, a second driving connection wire, a first light emitting device, a second light emitting device, and a spare electrode. Both the first driving connection wire and the second driving connection wire are located on the same side of the first connecting wire. The driving signal transmitted by the first driving connection wire is independent of a drive signal transmitted by the second driving connection wire. The first light emitting device is connected between the first connecting wire and the first driving connection wire. The second light emitting device is connected between the first connecting wire and the second driving connection wire. The spare electrode is located between the first driving connection wire and the second driving connection wire. The spare electrode includes a first part and two second parts. The first part is located between the two second parts. The first part extends in the first direction, and each of the two second parts extends in the second direction. An imaginary line extended from the first part along the first direction crosses over the two second parts.

In an embodiment of the present invention, the first direction of the LED panel as mentioned above is parallel to an extension direction of the first connecting wire.

In an embodiment of the present invention, the two second parts of the spare electrode of the LED panel as mentioned above neither overlap the first driving connection wire nor overlap the second driving connection wire.

In an embodiment of the present invention, the first part of the LED panel continuously extends between the two second parts, and the opposite two ends of the first part are individually connected to the two second parts.

In an embodiment of the present invention, the spare electrode of the LED panel as mentioned above further includes a bump part which extends from an end of one of the two second parts, wherein the bump part extends along the first direction away from the first part and is separated from one of the first driving connection wire and the second driving connection wire being more adjacent to the bump part with a spacing.

In an embodiment of the present invention, the LED panel as mentioned above further includes a driving bump part which overlaps one of the first driving connection wire and the second driving connection wire, wherein the driving bump part protrudes toward the spare electrode along the first direction and is separated from the spare electrode with a spacing.

In an embodiment of the present invention, the LED panel as mentioned above further includes a conductive component which electrically connects one of the two second parts of the spare electrode to one of the first driving connection wire and the second driving connection wire being more adjacent to the one of the two second parts.

In an embodiment of the present invention, the LED panel as mentioned above further includes a first secondary light emitting device. One end of the first secondary light emitting device is electrically connected to the first connecting wire, and another end of the first secondary light emitting device is electrically connected to the first part.

In an embodiment of present invention, the LED panel as mentioned above further includes a spare connection wire which electrically connects the first secondary light emitting device to the first part.

In an embodiment of the present invention, the second direction of the LED panel as mentioned above is parallel to the extension direction of the first connecting wire.

In an embodiment of the present invention, the LED panel as mentioned above further includes a driving bump part which overlaps one of the first driving connection wire and the second driving connection wire, wherein the driving bump part protrudes toward the spare electrode along the first direction and is separated from the spare electrode with a spacing.

In an embodiment of the present invention, the LED panel as mentioned above further includes a first secondary light emitting device. One end of the first secondary light emitting device is electrically connected to the first connecting wire, and another end of the first secondary light emitting device covers and is electrically connected to the driving bump part and the corresponding one of the two second parts.

In an embodiment of the present invention, the first part of the LED panel as mentioned above is divided into a first sub part and a second sub part. The first sub part and the second sub part are separated from each other by a disconnecting opening, the first sub part is located between the disconnecting opening and one of the two second parts, and the second sub part is located between the disconnecting opening and the other of the two second parts.

In an embodiment of the present invention, the LED panel as mentioned above further includes a first secondary light emitting device and a second secondary light emitting device. The first secondary light emitting device and the second secondary light emitting device are individually electrically connected to the first sub part and second sub part.

In an embodiment of the present invention, the first secondary light emitting device of the LED panel as mentioned above is connected to the first driving connection wire via the spare electrode, the second secondary light emitting device is electrically connected to the second driving connection wire via spare electrode, and the first secondary light emitting device and the second secondary light emitting devices are electrically independent with each other via the disconnecting opening.

In an embodiment of the invention, the LED panel as mentioned above further includes a second connecting wire, a third light emitting device, and a fourth light emitting device. The third light emitting device is connected between the second connecting wire and the first driving connection wire. The fourth light emitting device is connected between the second connecting wire and the second driving connection wire. The first light emitting device and the third light emitting device are arranged in one row between the first connecting wire and the second connecting wire, and the second light emitting device and the fourth light emitting device are arranged in another row between the first connecting wire and the second connecting wire. The first secondary light emitting device and the second secondary light emitting device are individually electrically connected to the first connecting wire and the second connecting wire.

In an embodiment of the present invention, both the first secondary light emitting device and the second secondary light emitting device of the LED panel as mentioned above are electrically connected to the first connecting wire.

In an embodiment of the present invention, the spare electrode the LED panel as mentioned above further includes a bump part which extends from an end of one of the two second parts toward one of the first driving connection wire and the second driving connection wire being more adjacent to the bump part and overlaps with one of the first driving connection wire and the second driving connection wire being more adjacent to the bump part.

In an embodiment of the present invention, the LED panel as mentioned above further includes a first secondary light emitting device. One end of the first secondary light emitting device is electrically connected to the first connecting wire, and another end of the first secondary light emitting device overlaps the disconnecting opening and is electrically connected to the first sub part and the second sub part. The first part is separated from one of the two second parts by another disconnecting opening.

In an embodiment of the present invention, the spare electrode and the first connecting wire of the LED panel as mentioned above are composed of the same conductive layer.

In an embodiment of the invention, the first light emitting device and the second light emitting device of the LED panel as mentioned above individually include a first electrode, a second electrode, a first semiconductor layer, a second semiconductor layer, and a light emitting layer. The light emitter layer is located between the first semiconductor layer and the second semiconductor layer, and the first electrode and the second electrode are located on the same side of the second semiconductor layer.

In an embodiment of the present invention, the luminous color of the first light emitting device of the LED panel as mentioned above is different from the luminous color of the second light emitting device.

In an embodiment of the invention, the LED panel as mentioned above further includes a second connecting wire, a third light emitting device, and a fourth light emitting device. The third light emitting device is connected between the second connecting wire and the first driving connection wire. The fourth light emitting device is connected between the second connecting wire and the second driving connection wire. The first light emitting device and the third light emitting device are arranged in one row along a row direction between the first connecting wire and the second connecting wire, and the second light emitting device and the fourth light emitting device are arranged in another row along the row direction between the first connecting wire and the second connecting wire. The luminous color of the first light emitting device is the same with the luminous color of the third light emitting device, and the luminous color of the second light emitting device is the same with the luminous color of the fourth light emitting device.

In an embodiment of the present invention, an oriented direction of each of the first light emitting device, the second light emitting device, the third light emitting device, and the fourth light emitting device of the LED panel as mentioned above is a third direction, and a non-right angle is included between the third direction and the row direction.

In an embodiment of the present invention, the row direction of the LED panel as mentioned above is intersected with the extension direction of the first connecting wire.

Based on the above, in the LED panel of the embodiment of the present invention, the repair time and material cost can be reduced so as to improve the repair yield of the LED panel by the spare electrode disposed between the first driving connection wire and the second driving connection wire having the first part and the second part, wherein the extension directions of the first part and the second part are intersected with each other.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 12 is a schematic top view illustrating an unrepaired LED panel according to a fourth embodiment of the disclosure.

FIG. 13 is a schematic top view illustrating a repaired LED panel according to a fourth embodiment of the disclosure.

FIG. 14 is a schematic top view illustrating an unrepaired LED panel according to a fifth embodiment of the disclosure.

FIG. 15 is a schematic top view illustrating a repaired LED panel according to a fifth embodiment of the disclosure.

FIG. 19 is a schematic top view illustrating an unrepaired LED panel according to a seventh embodiment of the disclosure.

FIG. 20 is a schematic top view illustrating a repaired LED panel according to a seventh embodiment of the disclosure.

FIG. 21 is a schematic top view illustrating an unrepaired LED panel according to an eighth embodiment of the disclosure.

FIG. 22 is a schematic top view illustrating a repaired LED panel according to an eighth embodiment of the disclosure.

DESCRIPTION OF THE EMBODIMENTS

Figure 1:
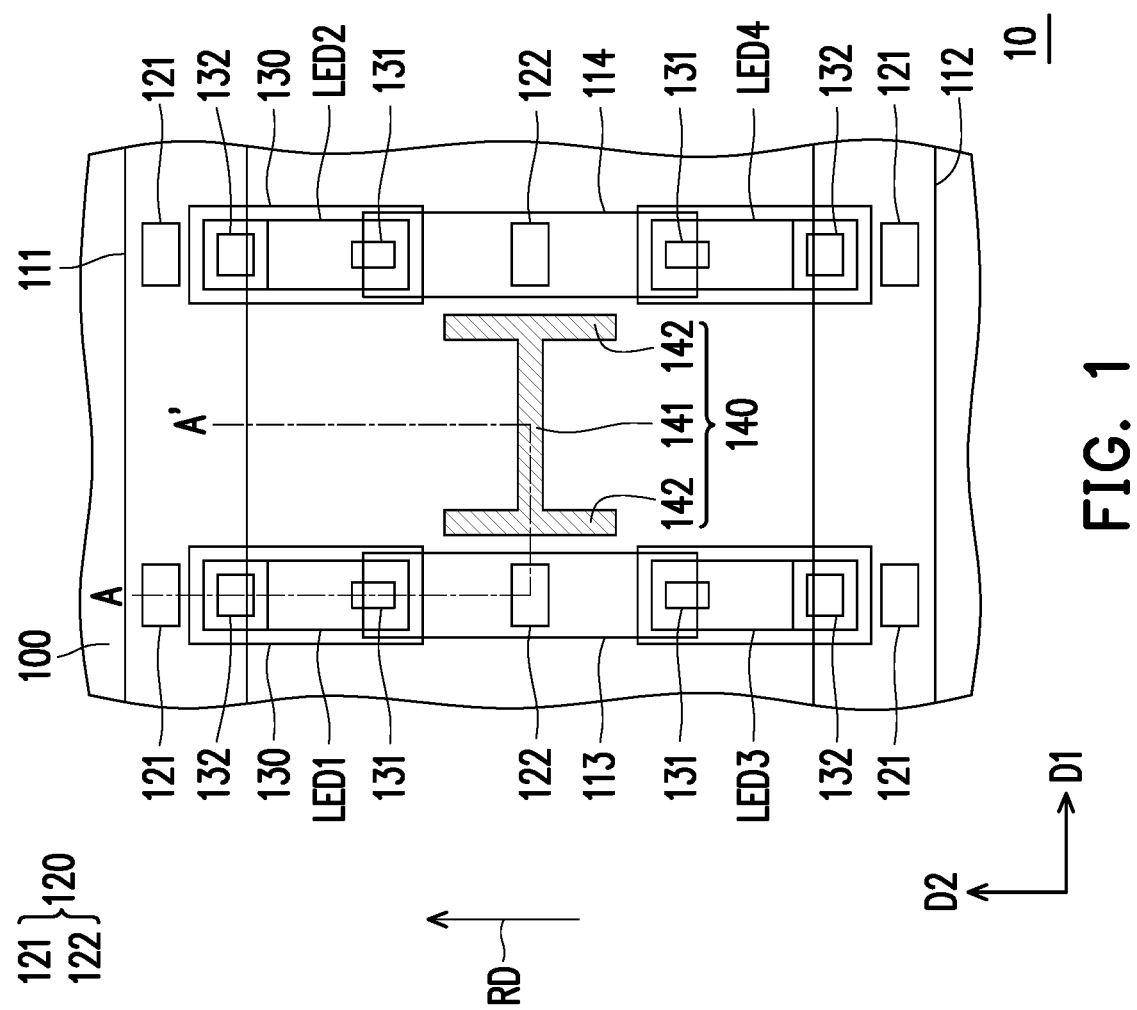
FIG. 1 is a schematic top view illustrating an unrepaired LED panel according to a first embodiment of the disclosure.

As used herein, "about", "approximate", "essentially", or "substantially" includes the values and the average values within acceptable deviations of the particular value determined by one of ordinary skill in the art, in view of the number of measurements and the specific number of errors associated with the measurement (i.e., the limits of the measurement system) are discussed. For example, "about" may mean within one or a standard deviation of the stated value, or within such as ±30%, ±20%, ±15%, ±10%, ±5%. Furthermore, the terms "about", "approximately", "essentially", or "substantially" as used herein may select a more acceptable range or standard deviation depending on the nature of the measurement, the nature of the cut, or other properties. The full part property is applied without a standard deviation.

In the drawings, the thickness of layers, films, panels, areas, and the like are exaggerated for clarity. It should be understood that when a device such as layer, film, area, or substrate is said to be "on" or "connected to" another device, it may be directly on the another device or connected to the another device, or the intermediate device may also exist. Otherwise, when one device is called as "directly on another device" or "directly connected to another device", there is no intermediate device. As used herein, "connected" may mean physically and/or electrically connected. Furthermore, "electrically connected" can have other devices between the two components.

Reference will now be made in detail to the exemplary embodiments of the invention. Whenever possible, the same device symbol is used in the schema and description to denote the same or similar parts.

Figure 2:
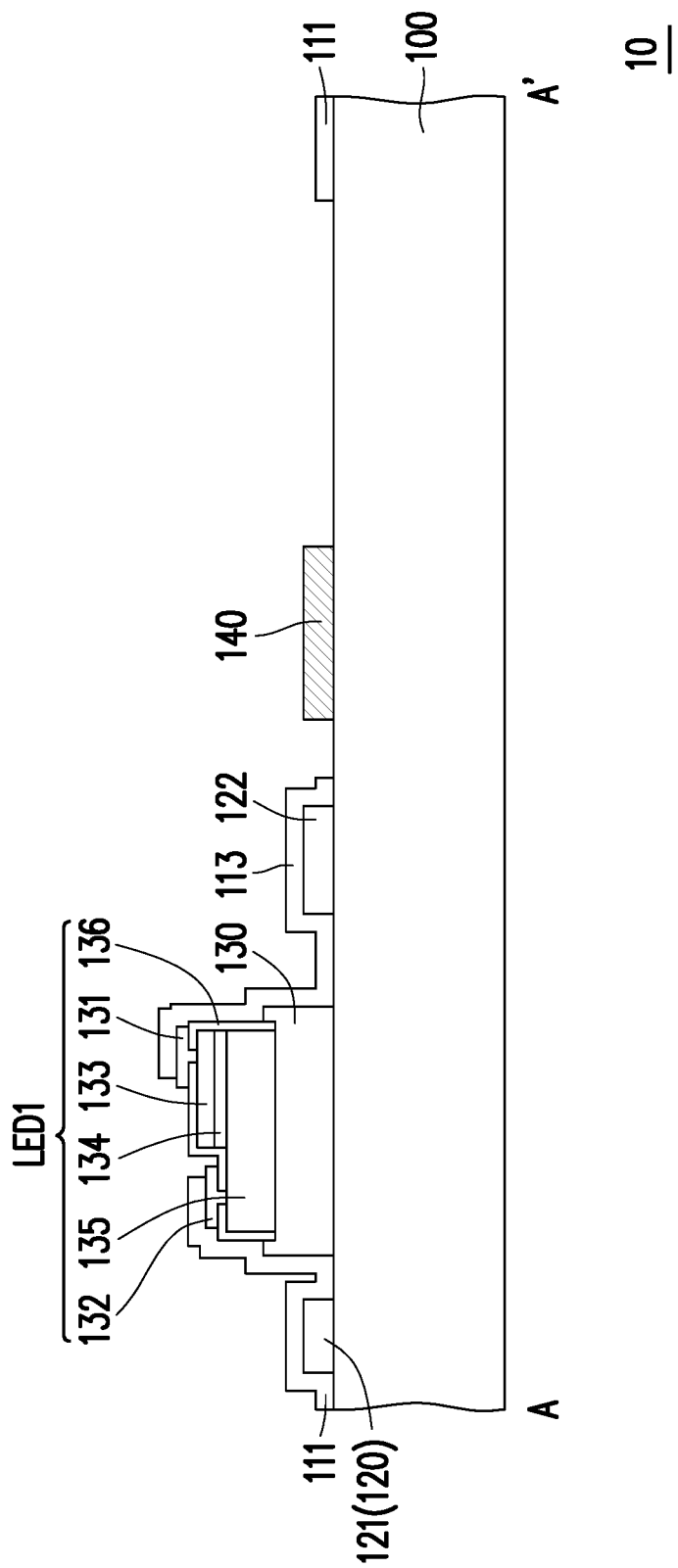
FIG. 2 is a schematic cross-section view illustrating the LED panel of FIG. 1.

FIG. 1 is a schematic top view illustrating an unrepaired LED panel 10 according to a first embodiment of the disclosure. FIG. 2 is a schematic cross-section view illustrating the LED panel 10 of FIG. 1. In particular, FIG. 2 corresponds to cross-section A-A' of FIG. 1. Referring to FIG. 1, the LED panel 10 includes a substrate 100, a plurality of light emitting devices, and the corresponding connecting wires. However, in order to clearly describe the individual components, FIG. 1 illustrates four light emitting devices as an example. The LED panel 10 includes a first light emitting device LED1, a second light emitting device LED2, a third light emitting device LED3, and a fourth light emitting device LED4. The first light emitting device LED1 and the third light emitting device LED3 are optionally arranged in a row along a row direction RD, and the second light emitting device LED2 and the fourth light emitting device LED4 are optionally arranged in another row along the row direction RD.

In this embodiment, the substrate 100 may include a driving circuit layer that can be used to provide driving signals to the first light emitting device LED1, the second light emitting device LED2, the third light emitting device LED3, and the fourth light emitting device LED4, which are composed of the components such as a data line, a scanning line, a peripheral traces and a driving components (e.g., a thin film transistor, a capacitor), but the present invention is not limited to this. In the part of the embodiment, the substrate 100 may not include the driver circuit layer, and the LED panel 10 may be connected to a driver circuit disposed at the external part through a circuit board or the like. In addition, in the present embodiment, the substrate 100 is, for example, a transparent glass substrate or a transparent soft substrate, and the material thereof is, for example, glass, quartz or organic polymer. However, the present invention is not limited thereto, and in other embodiments, the substrate 100 may also be an opaque material such as a conductive material, metal, wafer, ceramic, or other suitable material.

The LED panel 10 further includes a first connecting wire 111 and a second connecting wire 112. The first connecting wire 111 and the second connecting wire 112 individually extend in a direction D1. All of the first light emitting device LED1, the second light emitting device LED2, the third light emitting device LED3, and the fourth light emitting device LED4 are located between the first connecting wire 111 and the second connecting wire 112. In this embodiment, the row direction RD may be intersected the extension direction (i.e., the direction D1) of the first connecting wire 111 (or the second connecting wire 112). For example, the row direction RD can be substantially perpendicular to the extension direction of the first connecting wire 111 (or the second connecting wire 112), but the present invention is not limited thereto.

The LED panel 10 further includes a first driving connection wire 113 and a second driving connection wire 114. In this embodiment, the first driving connection wire 113 is connected between the first light emitting device LED1 and the third light emitting device LED3, and the second driving connection wire 114 is connected between the second light emitting device LED2 and the fourth light emitting device LED4. In this way, the first light emitting device LED1 and the third light emitting device LED3 are both connected to the first driving connection wire 113 and may be connected to the corresponding driving circuit through the first driving connection wire 113. Similarly, the second light emitting device LED 2 and the fourth light emitting device LED 4 are both connected to the second driving connection wire 114, and the second light emitting device LED 2 and the fourth light emitting device LED 4 may be connected to the corresponding driving circuit through the second driving connection wire 114.

The LED panel 10 further includes a spare electrode 140, and the spare electrode 140 is disposed between the first driving connection wire 113 and the second driving connection wire 114. More specifically, the spare electrode 140 includes a first part 141 and two second parts 142. The first part 141 is disposed between the two second parts 142, and an imaginary line extending from the first part 141 along the extension direction (i.e., the direction D1) crosses over the two second parts 142. For example, the first part 141 of the spare electrode 140 may continuously extend between the two second parts 142, and the opposite ends of the first part 141 are individually connected to the two second parts 142. In this embodiment, the extension direction of the two second parts 142 of the spare electrode 140 is substantially optionally perpendicular to the extension direction of the first part 141, but the present invention is not limited thereto. In this embodiment, the material of the spare electrode 140 may include metal, alloy, nitrides of metal material, oxides of metal material, nitrogen oxide of metal material, or other suitable material, or a stacked layer of metal material and the other conductive materials.

The first driving connection wire 113 and the second driving connection wire 114 are disposed on the opposite sides of the spare electrode 140 and located on the same side of the first connecting wire 111. In this embodiment, the vertical projection of the two second parts 142 of the spare electrode 140 on the substrate 100 is outside the vertical projection of the first driving connection wire 113 and the second driving connection wire 114 on the substrate 100. In other words, the two second parts 142 of the spare electrode 140 neither overlap the first driving connection wire 113 nor overlap the second driving connection wire 114.

The LED panel 10 may also optionally include a plurality of bonding patterns 130, which are arranged in an array and disposed on the substrate 100. Specifically, the first light emitting device LED1, the second light emitting device LED2, the third light emitting device LED3, and the fourth light emitting device LED4 may be individually connected to the corresponding bonding pattern 130 to be fixed on the substrate 100, but the present invention does not limited. In this embodiment, the material of the bonding pattern 130 may include epoxy, silicone, conductive adhesive, or the other suitable material.

Referring to FIG. 1 and FIG. 2 simultaneously, the first light emitting device LED1, the second light emitting device LED2, the third light emitting device LED3, and the fourth light emitting device LED4 may individually include a first electrode 131, a second electrode 132, a first semiconductor layer 133, a light emitting layer 134, and a second semiconductor layer 135. In the present embodiment, the second semiconductor layer 135, the light emitting layer 134, and the first semiconductor layer 133 may be sequentially stacked on the substrate 100, and the first electrode 131 and the second electrode 132 are located on the same side of the second semiconductor layer 135, that is, the first light emitting device LED1, the second light emitting device LED2, the third light emitting device LED3, and the fourth light emitting device LED4 are, for example, lateral type LED chips, but the present invention is not limited thereto. In some embodiments, the first light emitting device LED1, the second light emitting device LED2, the third light emitting device LED3, and the fourth light emitting device LED4 may also be flip-chip type LED chips.

On the other hand, in the present embodiment, the luminous color of the first light emitting device LED1 emitted and the third light emitting device LED3 emitted are, for example, red, and the luminous color of the second light emitting device LED2 and the fourth light emitting device LED4 are, for example, green. That is, the luminous colors of the first light emitting device LED1 (or the third light emitting device LED3) and the second light emitting device LED2 (or the fourth light emitting device LED4) may be optionally different, but the present invention is not limited thereto. The first light emitting device LED1, the second light emitting device LED2, the third light emitting device LED3, and the fourth light emitting device LED4 may further optionally include an insulating layer 136, and the first electrode 131 and the second electrode 132 penetrate the insulating layer 136 to electrically connect the first semiconductor layer 133 and second semiconductor layer 135, respectively, but the present invention is not limited to this.

In the present disclosure, the first electrode 131, the second electrode 132, the first semiconductor layer 133, the light emitting layer 134, and the second semiconductor layer 135 may individually be any first electrode, any second electrode, any first semiconductor pattern, any light emitting layer, and any second semiconductor pattern for a light emitting device known to those skilled in the art, and the first electrode 131, the second electrode 132, the first semiconductor layer 133, the light emitting layer 134, and the second semiconductor layer 135 may individually be formed by any method known to those skilled in the art, and thus will not be described herein.

In this embodiment, the description is taken as an example that the substrate 100 includes the driver circuit layer, but is not limited thereto. In order to enable the first light emitting device LED1, the second light emitting device LED2, the third light emitting device LED3, and the fourth light emitting device LED4 to be electrically connected to the driving circuit layer on the substrate 100, the LED panel 10 may further optionally include a plurality of connecting pads 120, which are electrically connected to the driving circuit layer on the substrate 100 individually. In this embodiment, in consideration of conductivity, the material of the connecting pad 120 is generally made of metal material. However, the present invention is not limited thereto. According to the other embodiments, the connecting pad 120 may also use other conductive materials such as alloy, nitrides of metal material, oxides of metal material, nitrogen oxides of metal material, or other suitable material, or metal, or the stacked layer of material and the other conductive materials.

The plurality of connecting pads 121 may include a plurality of first connecting pads 121 and a plurality of second connecting pads 122 which are arranged in an array and disposed on the substrate 100. In detail, in the direction D1, the first connecting pads 121 may be arranged in a row and the second connecting pads 122 may be arranged in a row. In the direction D2, the first connecting pads 121 and the second connecting pads 122 are alternately arranged on the same line, but the present invention is not limited to this. The first connecting wire 111 traverses across the first connecting pads 121 arranged in a row and is electrically connected to the first connecting pads 121. The second connecting wire 112 traverses across the first connecting pads 121 arranged in another row and is electrically connected to the first connecting pads 121. Furthermore, the first driving connection wire 113 and the second driving connection wire 114 individually overlap with the corresponding second connecting pad 122 to be individually electrically connected to the corresponding second connecting pad 122.

The spare electrode 140 is disposed between the corresponding two second connecting pads 122. The material of the spare electrode 140 and the connecting pads 120 may be optionally the same; that is, the spare electrode 140 and the connecting pads 120 may belong to the same conductive layer, but the present invention is not limited thereto.

The first light emitting device LED1 and the second light emitting device LED2 are individually disposed between the corresponding first connecting pad 121 and the corresponding second connecting pad 122. The third light emitting device LED3 and the fourth light emitting device LED4 are also individually disposed between the corresponding first connecting pad 121 and the corresponding second connecting pad 122. The first light emitting device LED1 and the third light emitting device LED3 are individually disposed on opposite sides of one corresponding second connecting pad 122, and the second light emitting device LED2 and the fourth light emitting device LED4 are individually configured in a mirroring manner on opposite sides of another corresponding second connecting pad 122.

In this embodiment, the first connecting wire 111 is electrically connected between the second electrode 132 of the first light emitting device LED1 and the first connecting pad 121 being adjacent to the first light emitting device LED1, so that the second electrode 132 of the first light emitting device LED1 is electrically connected to the driving circuit layer disposed on the substrate 100. In particular, the first connecting wire 111 may also be electrically connected between the second electrode 132 of the second light emitting device LED2 and the first connecting pad 121 being adjacent to the second light emitting device LED2, so that the second electrode 132 of the second light emitting device LED2 is electrically connected to the driving circuit layer disposed on the substrate 100. In other words, the first connecting wire 111 may electrically connect the second electrode 132 of the first light emitting device LED1 and the second electrode 132 of the second light emitting device LED2 so that the second electrode 132 of the first light emitting device LED1 and the second electrode 132 of the second light emitting device LED2 have the same potential, but the present invention is not limited thereto.

In the above, the second connecting wire 112 is electrically connected between the second electrode 132 of the third light emitting device LED3 and the first connecting pad 121 being adjacent to the third light emitting device LED3, so that the second electrode 132 of the third light emitting device LED3 is electrically connected to the driving circuit layer disposed on the substrate 100. In particular, the second connecting wire 112 may also be electrically connected between the second electrode 132 of the fourth light emitting device LED4 and the first connecting pad 121 being adjacent to the fourth light emitting device LED4, such that the second electrode 132 of the fourth light emitting device LED4 is electrically connected to the driving circuit layer disposed on the substrate 100. In other words, the second connecting wire 112 may electrically connect the second electrode 132 of the third light emitting device LED3 and the second electrode 132 of the fourth light emitting device LED4 so that the second electrode 132 of the third light emitting device LED3 and the second electrode 132 of the fourth light emitting device LED4 have the same potential, but the present invention is not limited thereto.

For example, the second electrodes 132 of the first light emitting device LED1, the second light emitting device LED2, the third light emitting device LED3, and the fourth light emitting device LED4 may optionally have the same reference potential, such as ground or the fixed potential, but the present invention is not limited to this. In some embodiments, the second electrodes 132 of the first light emitting device LED1, the second light emitting device LED2, the third light emitting device LED3, and the fourth light emitting device LED4 may also optionally have the same high potential. In this embodiment, the materials of the first connecting wire 111 and the second connecting wire 112 may include metal, alloy, nitrides of metal material, oxides of metal material, nitrogen oxides of metal material, or the other suitable material, or the stacking layer of the metal material and the other conductive materials.

In this embodiment, the first driving connection wire 113 is connected to the first electrode 131 of the first light emitting device LED1 and the second connecting pad 122 positioned between the first light emitting device LED1 and the third light emitting device LED3, so that the first electrode 131 of the first light emitting device LED1 is electrically connected to the driving circuit layer disposed on the substrate 100. In particular, the first driving connection wire 113 may be also optionally connected to the first electrode 131 of the third light emitting device LED3 and the second connecting pad 122 positioned between the first light emitting device LED1 and the third light emitting device LED3 to enable the first electrode 131 of the third light emitting device LED3 to electrically connect the driver circuit layer disposed on the substrate 100. In other words, the first driving connection wire 113 is electrically connected to the first electrode 131 of the first light emitting device LED1 and the first electrode 131 of the third light emitting device LED3 so that the first electrode 131 of the first light emitting device LED1 and the first electrode 131 of the third light emitting device LED3 have the same potential, but the present invention is not limited thereto.

Taking the above, similarly, the second driving connection wire 114 is connected to the first electrode 131 of the second light emitting device LED2 and the second connecting pad 122 positioned between the second light emitting device LED2 and the fourth light emitting device LED4, so that the first electrode 131 of the second light emitting device LED2 is electrically connected to the driving circuit layer disposed on the substrate 100. In particular, the second driving connection wire 114 may also optionally connect to the first electrode 131 of the fourth light emitting device LED4 and the second connecting pad 122 positioned between the second light emitting device LED2 and the fourth light emitting device LED4, so that the first electrode 131 of the fourth light emitting device LED4 is electrically connected to the driver circuit layer disposed on the substrate 100. In other words, the second driving connection wire 114 may electrically connect to the first electrode 131 of the second light emitting device LED2 and the first electrode 131 of the fourth light emitting device LED4 so that the first electrode 131 of the second light emitting device LED2 and the first electrode 131 of the fourth light emitting device LED4 have the same potential, but the present invention is not limited thereto.

When the LED panel 10 emits light, the two first electrodes 131 of the first light emitting device LED1 and the third light emitting device LED3 may be optionally applied with the first driving potential, the two first electrodes 131 of the second light emitting device LED2 and the fourth light emitting device LED4 may be optionally applied with the second driving potential. The first driving potential can be different from the second driving potential, so that the first light emitting device LED1 and the second light emitting device LED2 exhibit the different brightness. Thus, the LED panel 10 may be used to display a picture and be used as a display panel. That is to say, the driving signal transmitted by the first driving connection wire 113 is independent of the driving signal transmitted by the second driving connection wire 114, but the present invention is not limited thereto.

In this embodiment, the materials of the first driving connection wire 113 and the second driving connection wire 114 may include metal, alloy, nitrides of metal material, oxides of metal material, nitrogen oxides of metal material, or other suitable material, or the stacked layers of the metal material and the other conductive materials. For example, the first connecting wire 111, the second connecting wire 112, the first driving connection wire 113, and the second driving connection wire 114 may optionally belong to the same film layer. However, the present invention is not limited thereto. According to other embodiments, the first connecting wire 111, the second connecting wire 112, the first driving connection wire 113, and the second driving connection wire 114 may also individually belong to different film layers.

It should be noted that present invention does not limit the number of the light emitting devices connected to the same first driving connection wire 113 (or the second driving connection wire 114). In some embodiments, the number of the light emitting devices connected to the same first driving connection wire 113 (or the second driving connection wire 114) is also one or more than three. As can be seen from FIG. 1, the first light emitting device LED1 and the third light emitting device LED3 can be applied with the same driving signal to exhibit the same brightness. Therefore, when the driving circuit layer is disposed on the substrate 100, the driving circuit layer may include an active device connected to the first driving connection wire 113 to transmit the corresponding driving signal to the first light emitting device LED1 and the third light emitting device LED3 by the control of the active device. In other embodiments, the LED panel 10 may include a plurality of micro integrated circuits (micro ICs). For example, a plurality of light emitting devices of different luminous colors and the corresponding driving connection wires may be optionally connected to the micro integrated circuit, and a plurality of spare electrodes may be individually disposed between each two adjacent light emitting devices so that each light emitting device can be controlled by a micro integrated circuit.

Figure 3:
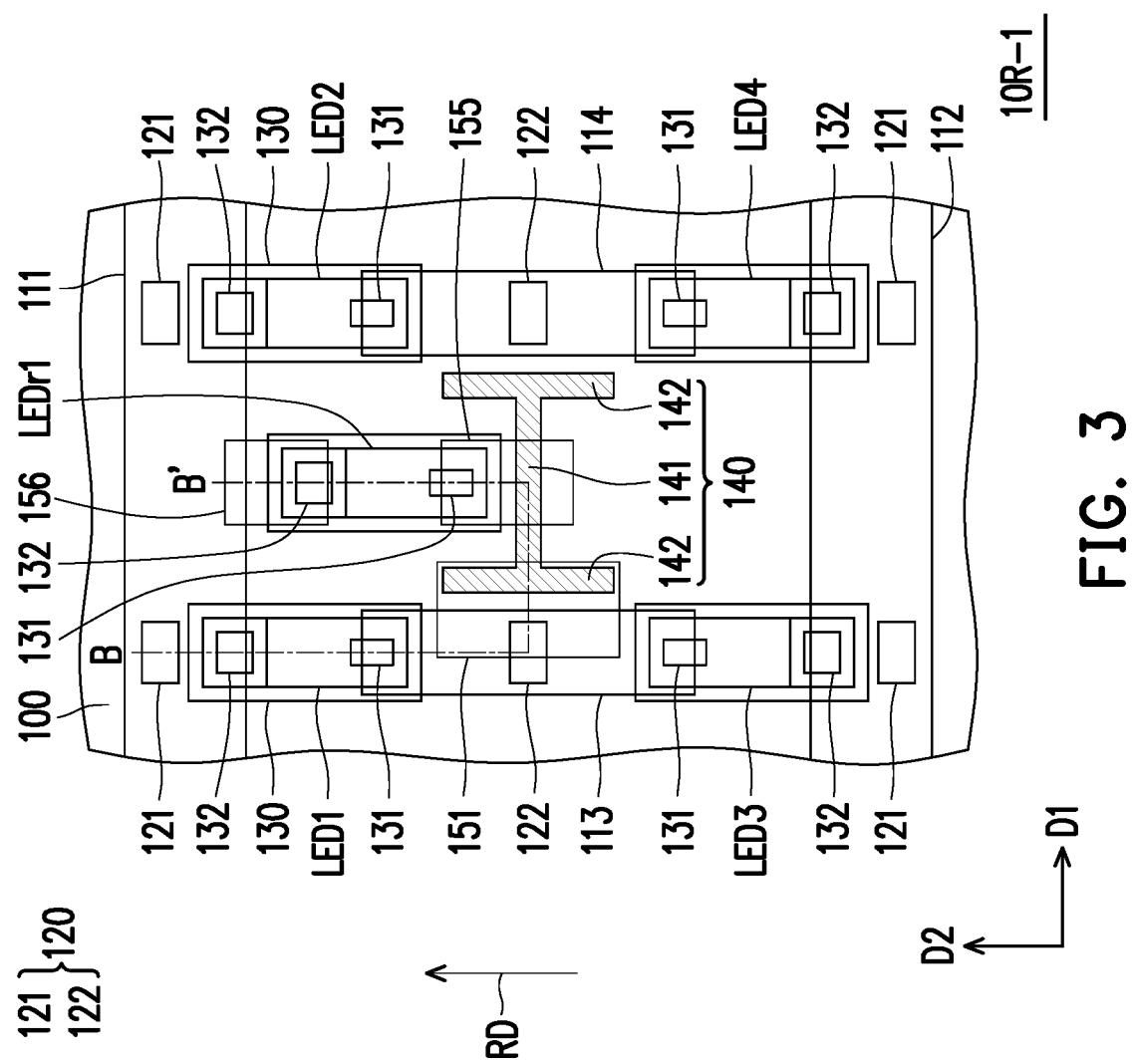
FIG. 3 is a schematic top view illustrating a repaired LED panel according to a first embodiment of the disclosure.
Figure 4:
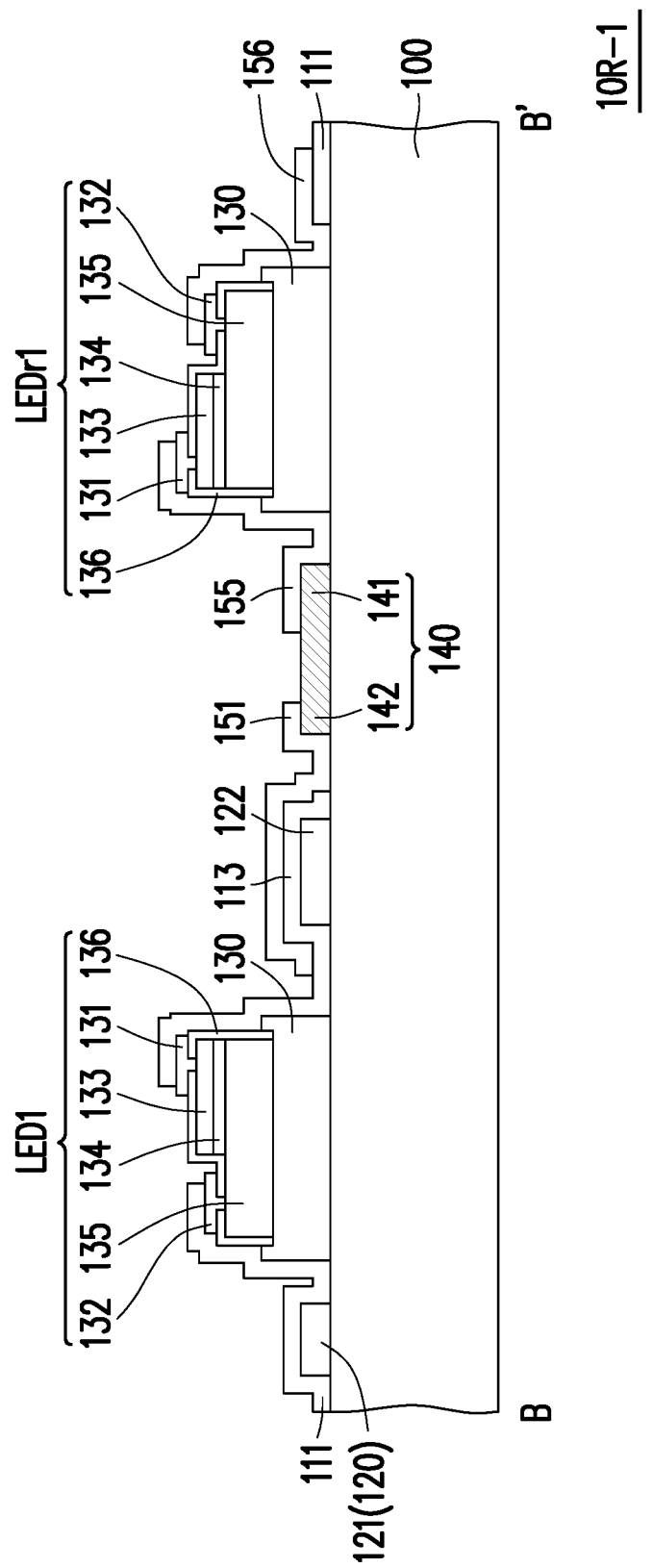
FIG. 4 is a schematic cross-section view illustrating the LED panel of FIG. 3.

FIG. 3 is a schematic top view illustrating a repaired LED panel 10R-1 according to a first embodiment of the disclosure. FIG. 4 is a schematic cross-section view illustrating the LED panel 10R-1 of FIG. 3. In particular, FIG. 4 corresponds to cross-section B-B' of FIG. 3. Referring to FIG. 3 and FIG. 4, the components of the LED panel 10R-1 are at least partially identical to the LED panel 10 of FIG. 1. Therefore, the same components may be referred to the foregoing description without further elaboration. In this embodiment, the LED panel 10R-1 is obtained, for example, after the LED panel 10 is repaired, but is not limited thereto. In the actual structure design, the component layout presented in FIG. 1 and the component layout presented in FIG. 3 can exist in the same LED panel (or in the display panel), but not limited to this. For example, the repairing process includes transposing (migrating) a first secondary light emitting device LEDr1 on the substrate 100 and forming a conductive component 151, a first spare connection wire 155, and a second spare connection wire 156 on the substrate 100. It should be noted that the composition structure and type of the first secondary light emitting device LEDr1 and the first light emitting device LED1 may be optionally the same, that is, the first secondary light emitting device LEDr1 also has the first electrode 131, the second electrode 132, the first semiconductor layer 133, the light emitting layer 134, and the second semiconductor layer 135, but the present invention is not limited thereto. In addition, the present invention does not limit the number of configurations of the conductive component 151, the first spare connection wire 155, and the second spare connection wire 156, depending on the patch design of the LED panel.

In detail, the LED panel 10R-1 may optionally include the conductive component 151, the first spare connection wire 155, and the second spare connection wire 156, wherein the first spare connection wire 155 is connected between the first electrode 131 of the first secondary light emitting device LEDr1 and the first part 141 of the spare electrode 140, and the second spare connection wire 156 is connected between the second electrode 132 of the first secondary light emitting device LEDr1 and the first connecting wire 111. For example, in the present embodiment, the luminous color of the first secondary light emitting device LEDr1 emitted and the first light emitting device LED1 (or the third light emitting device LED3) emitted may be optionally the same, and the conductive component 151 may be optionally connected to the first driving connection wire 113 and one of the two second parts 142 of the spare electrode 140 being more adjacent to the first driving connection wire 113. In the LED panel 10R-1, the first secondary light emitting device LEDr1, the first light emitting device LED1, and the third light emitting device LED3 have the same luminous color. Therefore, the first secondary light emitting device LEDr1 can be configured to replace at least one of the first light emitting device LED1 and the third light emitting device LED3 being unable to emit light. In other words, in the production process of the LED panel 10, if it is detected that a part of the light emitting devices cannot be enabled, the above-mentioned repairing method can be used to transpose the enabled light emitting device to the substrate 100 to replace the light emitting device that can't be enabled so that the yield of the LED panel 10 can be effectively improved. In addition, the first secondary light emitting device LEDr1, the first light emitting device LED1, and the third light emitting device LED3 may also optionally enabled and emit light simultaneously to enhance the brightness of the corresponding luminous color.

In some embodiments, the luminous color of the first secondary light emitting device LEDr1 emitted may be optionally the same as the luminous color of the second light emitting device LED2 (or the fourth light emitting device LED4), and the conductive component 151 may be optionally connected to the second driving connection wire 114 and one of the two second parts 142 of the spare electrode 140 being more adjacent to the second driving connection wires 114. That is, the first secondary light emitting device LEDr1 may be configured to replace at least one of the second light emitting device LED2 and the fourth light emitting device LED4 being unable to emit light.

In this embodiment, the materials of the conductive component 151, the first spare connection wire 155, and the second spare connection wire 156 may include metal, alloy, nitrides of metal material, oxides of metal material, nitrogen oxides of metal material, or other suitable material, or the stacked layer of metal material and the other conductive materials. For example, the conductive component 151, the first spare connection wire 155, and the second spare connection wire 156 may optionally belong to the same film layer, but the present invention is not limited thereto. On the other hand, the present invention does not limit the implementation aspect of the conductive component 151. In some embodiments, the conductive component 151 may also be formed by welding, and the welding method may include laser welding; in other embodiments, the conductive component 151, the first spare connection wire 155, or the second spare connection wire 156 may also be formed by dispensing (e.g., the gold glue, the silver glue). In this embodiment, the first secondary light emitting device LEDr1 is optionally fixed to the substrate 100 through a bonding pattern 130.

Figure 5:
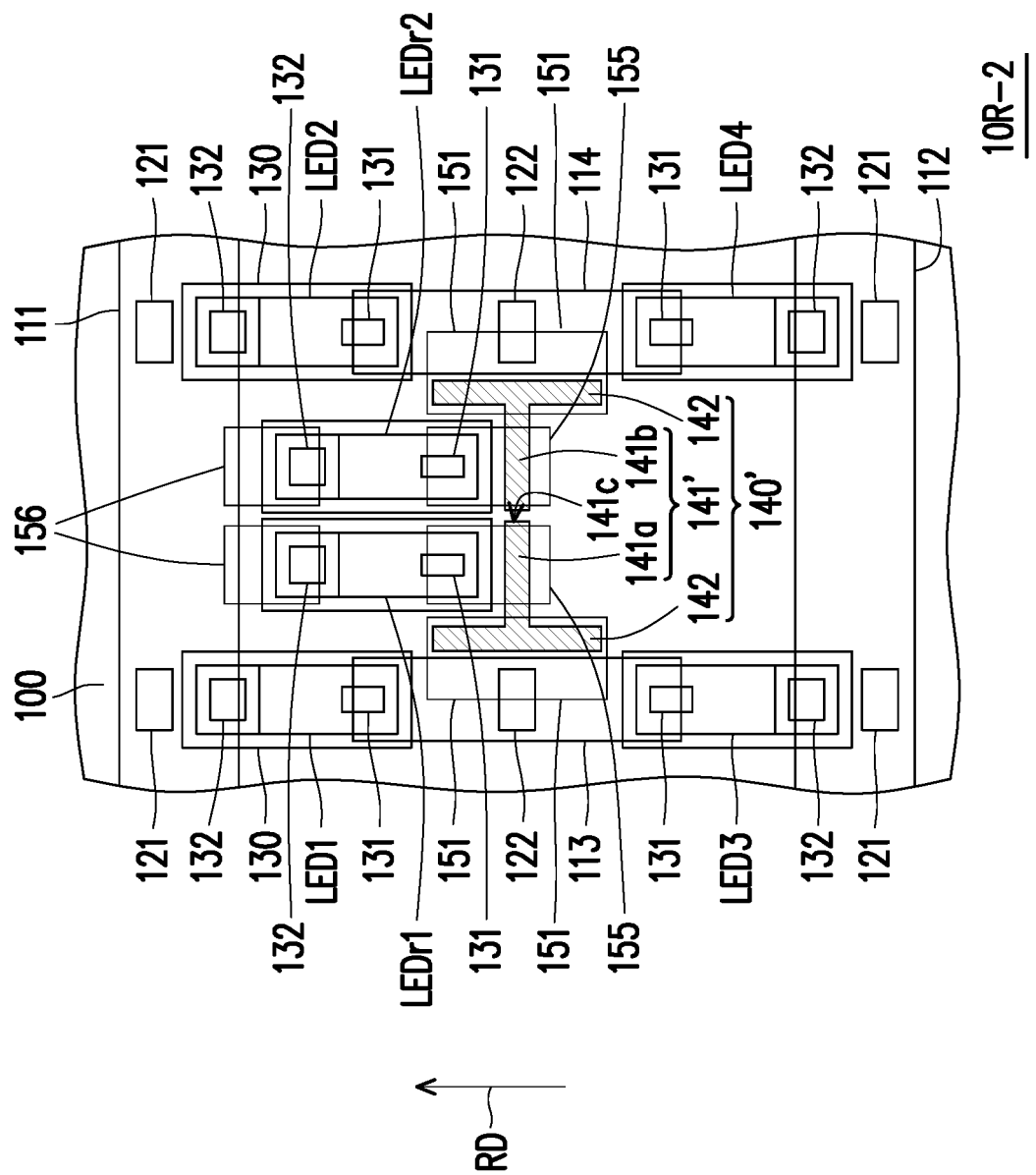
FIG. 5 is a schematic top view illustrating a repaired LED panel by another method according to a first embodiment of the disclosure.

FIG. 5 is a schematic top view illustrating a repaired LED panel 10R-2 by another method according to a first embodiment of the disclosure. Referring to FIG. 5, compared with the repaired LED panel 10R-1 of FIG. 3, the repaired LED panel 10R-2 of the present embodiment further includes a second secondary light emitting device LEDr2 and a corresponding set of the first spare connection wire 155 and the second spare connection wire 156. The first secondary light emitting device LEDr1 and the second secondary light emitting device LEDr2 are disposed between the first light emitting device LED1 and the second light emitting device LED2, and are individually electrically connected to the first connecting wire 111 through the corresponding second spare connection wire 156.

In addition, the repairing process of the present embodiment may further optionally include a cutting step such that the first part 141' of the spare electrode 140' has a disconnecting opening 141c. In detail, the first part 141' may be divided into a first sub part 141a and a second sub part 141b, the first sub part 141a and the second sub part 141b are spaced apart from each other by a disconnecting opening 141c, and the first sub part 141a is positioned between the disconnecting opening 141c and one of the two second parts 142, the second sub part 141b is positioned between the disconnecting opening 141c and the other of the two second parts 142. The first secondary light emitting device LEDr1 and the second secondary light emitting device LEDr2 are individually located on the opposite sides of the disconnecting opening 141c, and they are individually electrically connected to the first sub part 141a and the second sub part 141b of the spare electrode 140' through the corresponding first spare connection wire 155. In this embodiment, the method of cutting the step may include the laser cutting.

For example, the luminous colors of the first secondary light emitting device LEDr1 and the first light emitting device LED1 may be optionally the same, the luminous colors of the second secondary light emitting device LEDr2 and the second light emitting device LED2 may be optionally the same, and the luminous colors of the first secondary light emitting device LEDr1 and the second secondary light emitting device LEDr2 may be optionally different, but the present invention is not limited thereto. In addition, the number of the conductive component 151 of the LED panel 10R-2 in this embodiment is, for example, two, one of the conductive components 151 is connected between the first driving connection wire 113 and one of the two second parts 142 of the spare electrode 140' being more adjacent to the first driving connection wire 113, and another of the conductive components 151 is connected between the second driving connection wire 114 and one of the two second parts 142 of the spare electrode 140' being more adjacent to the second driving connection wires 114. In this way, the spare electrode 140' can be configured to meet the repairing requirements for the two adjacent rows of light emitting devices, thereby helping to improve the repair yield of the LED panel 10.

Figure 7:
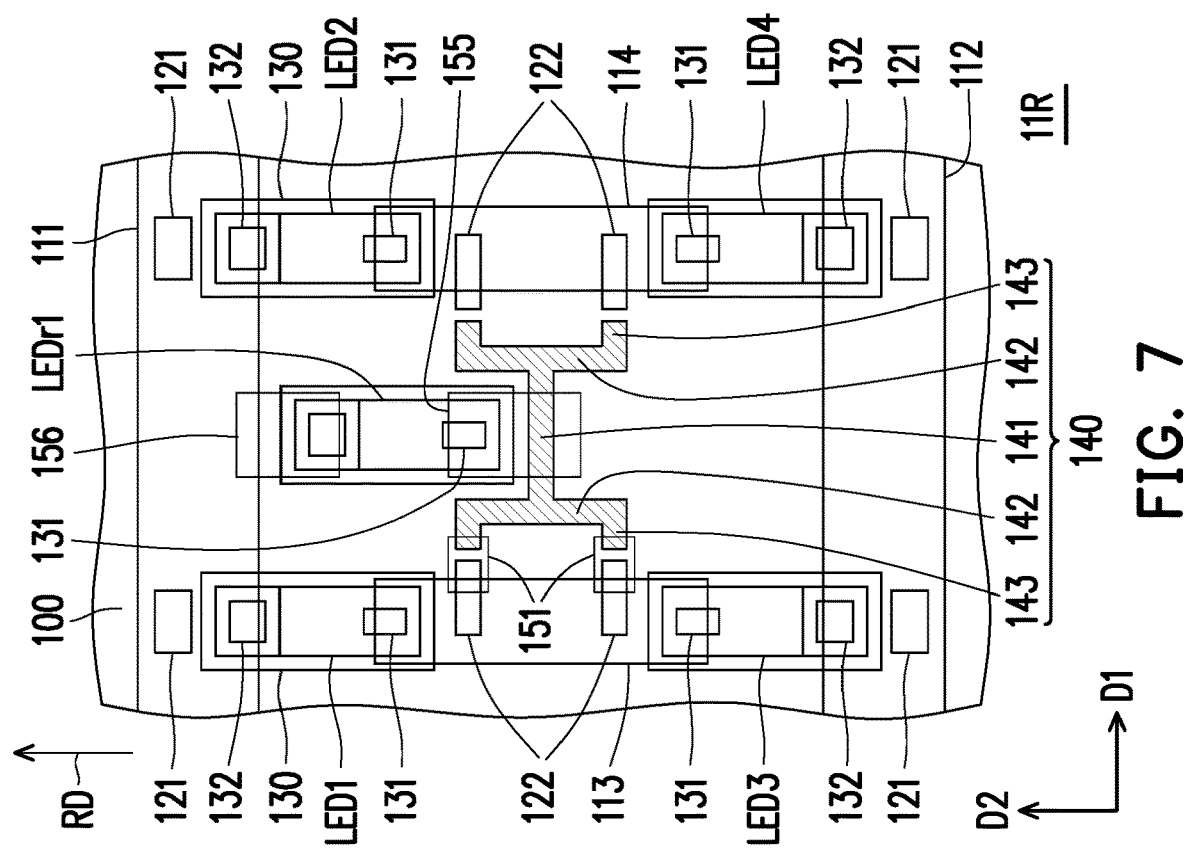
FIG. 7 is a schematic top view illustrating a repaired LED panel according to a second embodiment of the disclosure.
Figure 6:
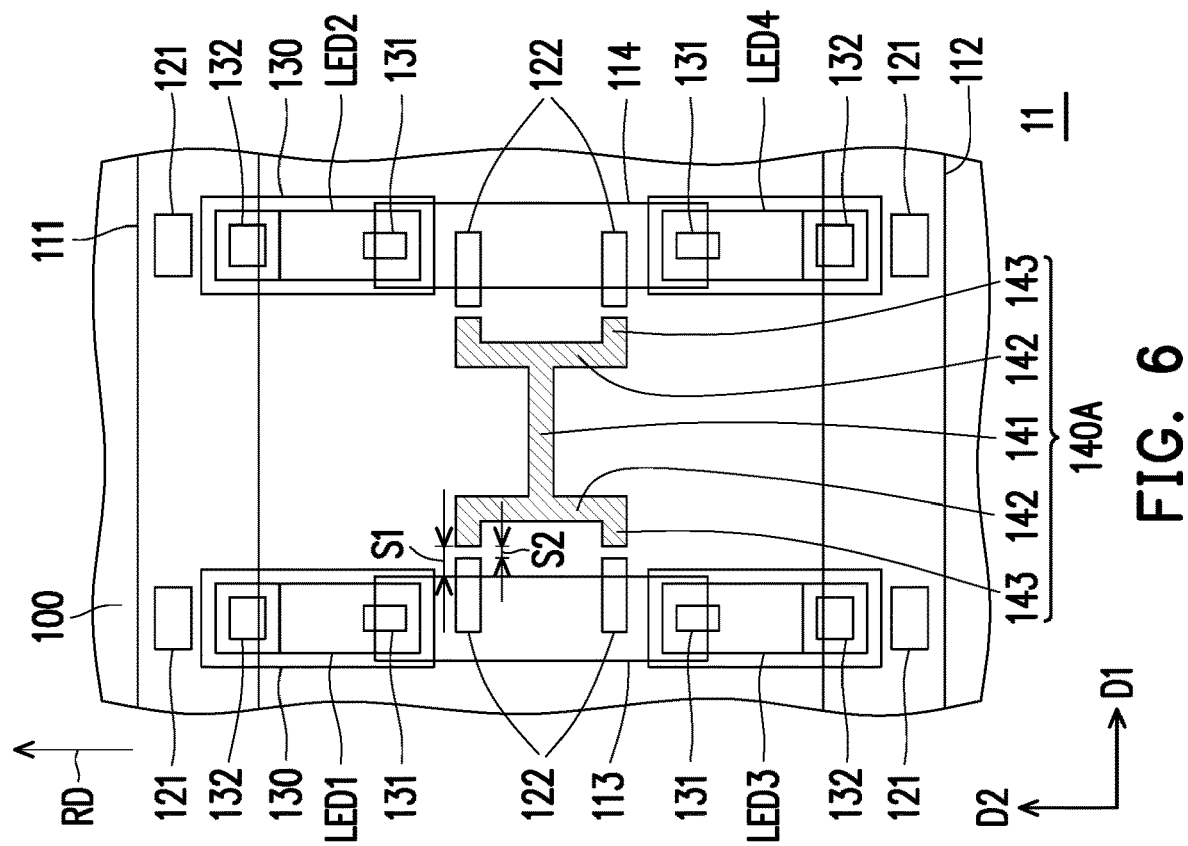
FIG. 6 is a schematic top view illustrating an unrepaired LED panel according to a second embodiment of the disclosure.

FIG. 6 is a schematic top view illustrating an unrepaired LED panel 11 according to a second embodiment of the disclosure. FIG. 7 is a schematic top view illustrating a repaired LED panel 11R according to a second embodiment of the disclosure.

Referring to FIG. 6, to compare with the LED panel 10 of FIG. 1, the spare electrode 140A of the LED panel 11 may optionally include four bump parts 143, which individually extends from the opposite ends of the two second parts 142 along the first direction D1 away from the first part 141, and a vertical projection of each of the bump parts 143 on the substrate 100 is separated from a vertical projection of one of the first driving connection wire 113 and the second driving connection wire 114 being more adjacent to the bump parts 143 with a spacing S1. Furthermore, the number of second connecting pads 122 which overlap the first driving connection wire 113 or the second driving connection wire 114 is, for example, two, each of the second connecting pads 122 is protruded toward the spare electrode 140A along the direction D1, and the vertical projection of each of the second connecting pads 122 on the substrate 100 is separated from the vertical projection of the spare electrode 140A on the substrate 100 with a spacing S2.

For example, the spacing S2 included between the vertical projection of each second connecting pad 122 on the substrate 100 and the vertical projection of one of the four bump parts 143 of the spare electrode 140A being more adjacent to the vertical projection of the corresponding connecting pad 122 on the substrate 100 may be optionally less than the spacing S1 included between the vertical projection of each bump part 143 on the substrate 100 and one of the first driving connection wire 113 and the second driving connection wire 114 being more adjacent to the vertical projection of the corresponding bump part 143 on the substrate 100. In this way, the layout range of the conductive component (such as silver glue) can be reduced, which helps to reduce the repair time and material cost and improve the repaired yield of the LED panel 11.

In addition, as can be seen from FIG. 7, compared to the repaired LED panel 10R of FIG. 3, the number of the conductive components 151 of the repaired LED panel 11R of the present embodiment is, for example, two to electrically connect the bump part 143 to the corresponding second connecting pad 122.

Figure 8:
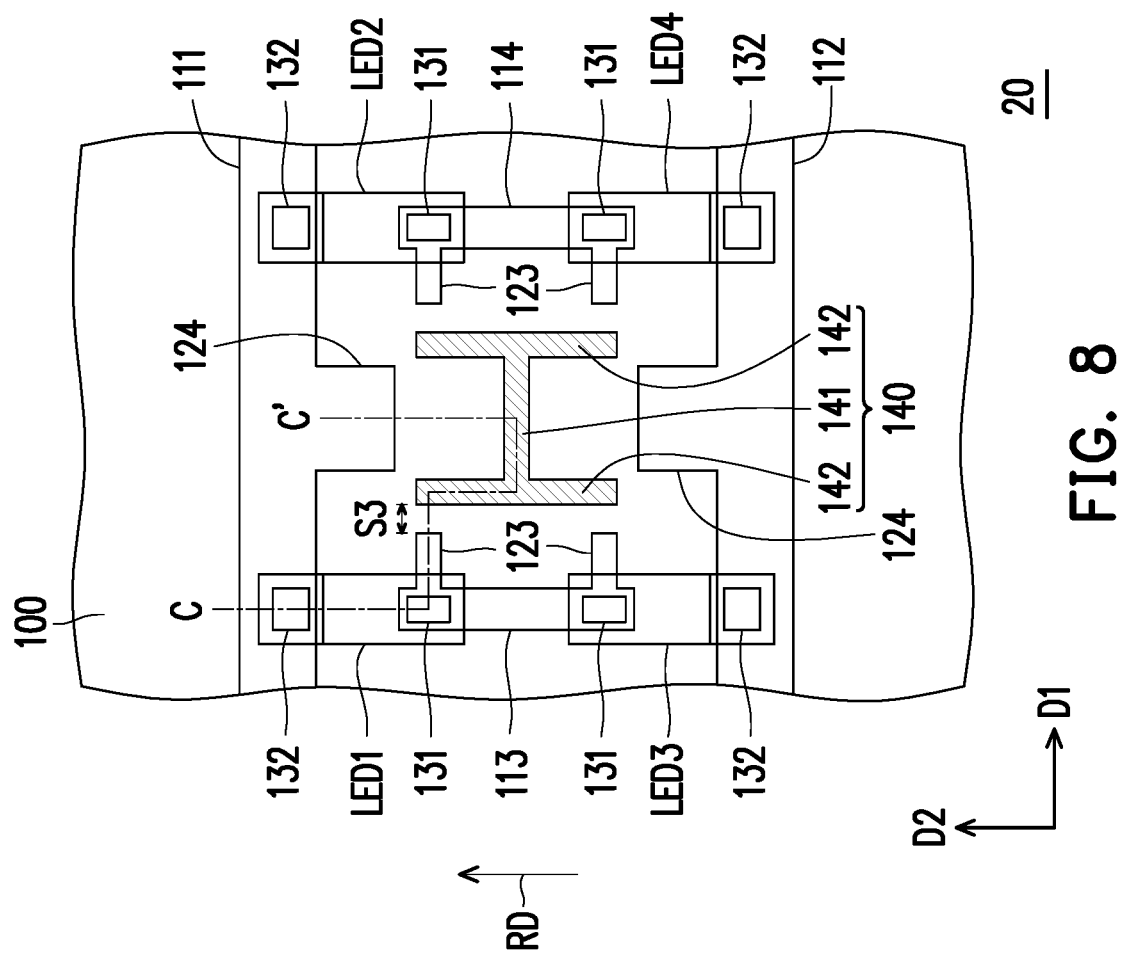
FIG. 8 is a schematic top view illustrating an unrepaired LED panel according to a third embodiment of the disclosure.
Figure 9:
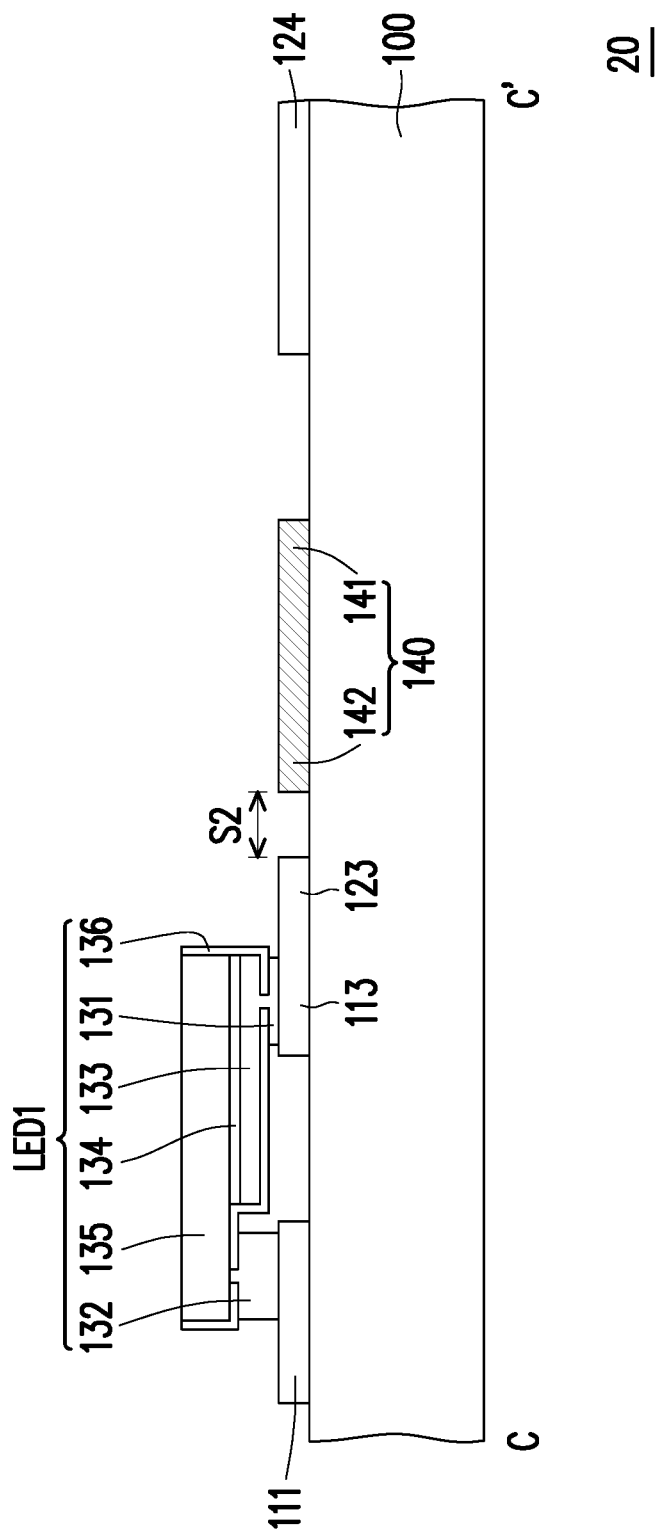
FIG. 9 is a schematic cross-section view illustrating the LED panel of FIG. 8.

FIG. 8 is a schematic top view illustrating an unrepaired LED panel 20 according to a third embodiment of the disclosure. FIG. 9 is a schematic cross-section view illustrating a LED panel 20 of FIG. 8. In particular, FIG. 9 corresponds to cross-section C-C' of FIG. 8.

Referring to FIG. 8, the LED panel 20 includes the first connecting wire 111, the first driving connection wire 113, the second driving connection wire 114, the spare electrode 140, the first light emitting device LED1, and the second light emitting device LED2. The LED panel 20 may also optionally include the second connecting wire 112, the third light emitting device LED 3, and the fourth light emitting device LED 4. The relative configuration relationship between the first connecting wire 111, the second connecting wire 112, the first driving connection wire 113, the second driving connection wire 114, the spare electrode 140, the first light emitting device LED1, the second light emitting device LED2, the third light emitting device LED3, the fourth light emitting device LED4 and the material composition of them are similar to those of the LED panel 10 of FIG. 1. Therefore, the relative configuration relationship and the material composition of the above components of the present disclosure may be referred to the description of the first embodiment, and will not be repeated here.

Referring to FIG. 8 and FIG. 9 simultaneously, in the present embodiment, the first light emitting device LED1, the second light emitting device LED2, the third light emitting device LED3, and the fourth light emitting device LED4 are, for example, flip-chip type LED chips. That is, the first semiconductor layer 133, the light emitting layer 134, and the second semiconductor layer 135 of the first light emitting device LED1 (or the second light emitting device LED2, the third light emitting device LED3, the fourth light emitting device LED4) may sequentially appear on the substrate 100, and the first electrode 131 and the second electrode 132 are located between the second semiconductor layer 135 and the substrate 100, but the present invention is not limited thereto.

In addition, the LED panel 20 further includes a driving bump part 123. One end of the driving bump part 123 is connected to one of the first driving connection wire 113 and the second driving connection wire 114, another end of the driving bump part 123 is protruded toward the spare electrode 140 along the direction D1, and the vertical projection of the driving bump part 123 on the substrate 100 is separated from the vertical projection of the spare electrode 140 on the substrate 100 with a spacing S3 so that the driving bump part 123 is not directly connected to the spare electrode 140. In addition, the LED panel 20 may further optionally include a connecting bump part 124, one end of the connecting bump part 124 is connected to one of the first connecting wire 111 and the second connecting wire 112, and another end of the connecting bump part 124 is protruded toward the spare electrode 140 along the direction D2.

In the present embodiment, the first connecting wire 111, the second connecting wire 112, the first driving connection wire 113, the second driving connection wire 114, the spare electrode 140, the driving bump part 123, and the connecting bump part 124 may optionally belong to the same conductive layer. The first connecting wire 111, the second connecting wire 112, the first driving connection wire 113, the second driving connection wire 114, and the spare electrode 140 are spaced apart from each other, and the driving bump part 123, the connecting bump part 124, and the spare electrode 140 are spaced apart from each other. In this embodiment, the said driving bump part 123 refers to the part protruded from the driving connection wire, and the said connecting bump part 124 refers to the part protruded from the connecting wire. The driving bump part 123 can be integrated with the corresponding driving connection wire, and the connecting bump part 124 can be integrated with the corresponding connecting wire, but the present invention is not limited thereto.

Figure 10:
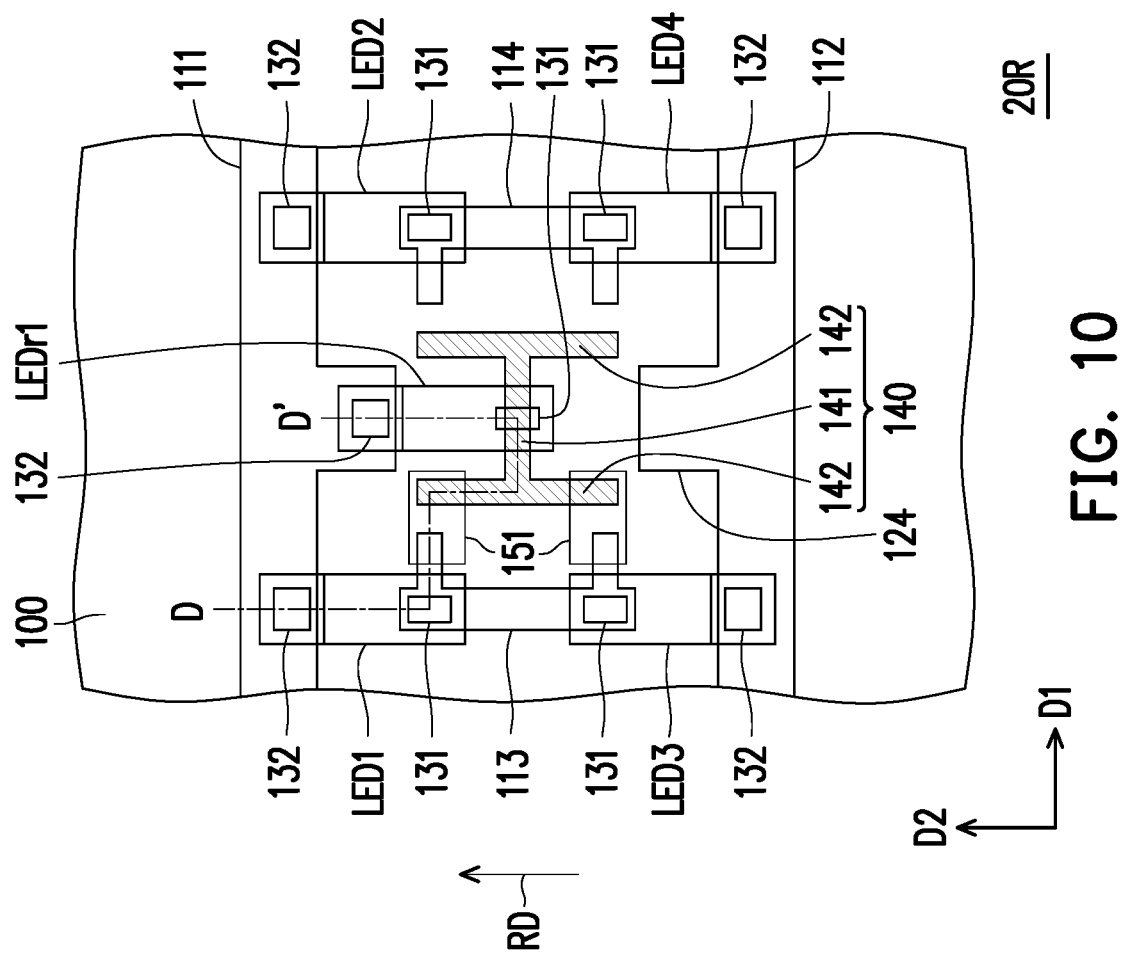
FIG. 10 is a schematic top view illustrating a repaired LED panel according to a third embodiment of the disclosure.
Figure 11:
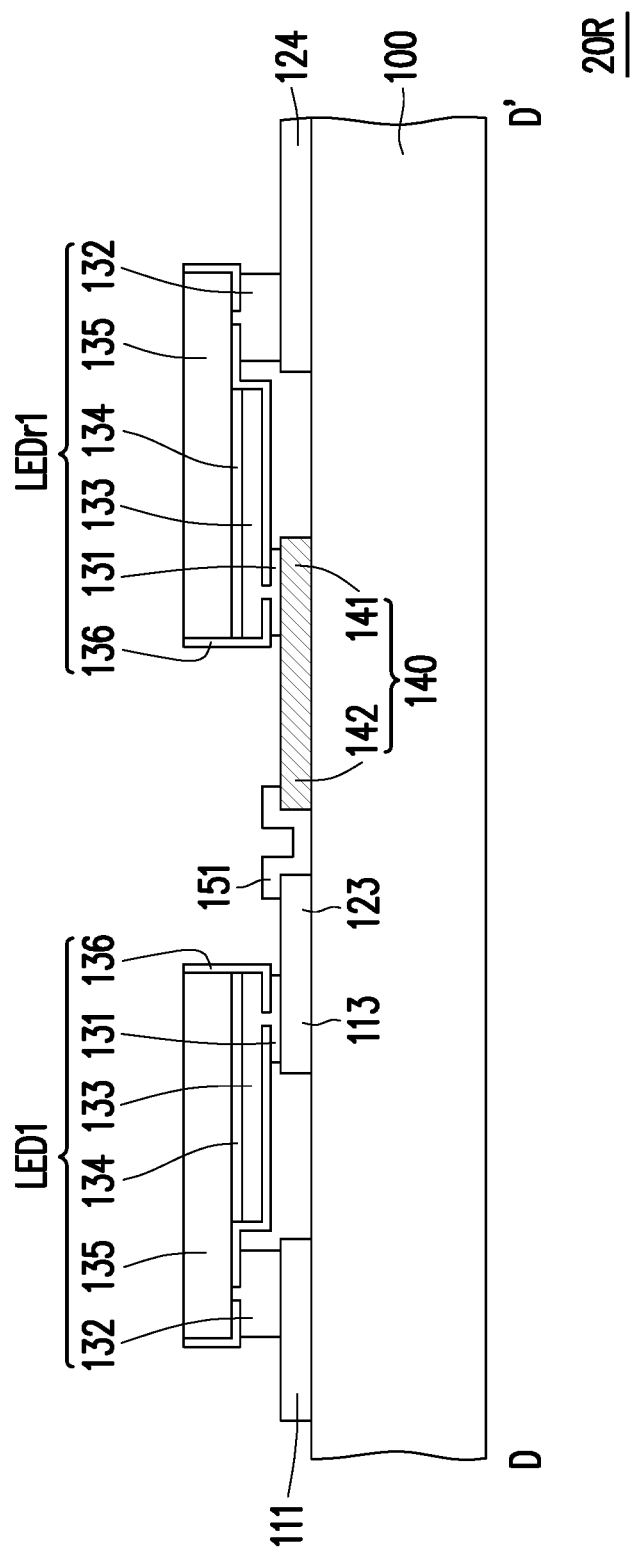
FIG. 11 is a schematic cross-section view illustrating the LED panel of FIG. 10.

FIG. 10 is a schematic top view illustrating a repaired LED panel 20R according to a third embodiment of the disclosure. FIG. 11 is a schematic cross-section view illustrating the LED panel 20R of FIG. 10. In particular, FIG. 11 corresponds to cross-section D-D' of FIG. 10. Referring to FIG. 10 and FIG. 11, the repaired LED panel 20R further includes a first secondary light emitting device LEDr1, and the luminous color of the first secondary light emitting device LEDr1 may be optionally same with the luminous color of one of the first light emitting device LED1 and the second light emitting device LED2. Moreover, the composition structure and type of the first secondary light emitting device LEDr1 and the first light emitting device LED1 (or the second light emitting device LED2) may be optionally the same. That is, the first secondary light emitting device LEDr1 of the present embodiment is also a flip-chip type LED chip and has the first electrode 131, the second electrode 132, the first semiconductor layer 133, the light emitting layer 134, and the second semiconductor layer 135, but the present invention is not limited to this.

In this embodiment, the vertical projection of the first electrode 131 of the first secondary light emitting device LEDr1 on the substrate 100 overlaps the vertical projection of the first part 141 of the spare electrode 140 on the substrate 100, and the first electrode 131 is electrically connected to the first part 141 of the spare electrode 140. For example, the vertical projection of the second electrode 132 of the first secondary light emitting device LEDr1 on the substrate 100 may optionally overlaps the vertical projection of the connecting bump part 124 of the first connecting wire 111 on the substrate 100, and the second electrode 132 is electrically connected to the connecting bump part 124 which is connected to the first connecting wire 111.

The repaired LED panel 20R may also optionally include the conductive component 151, and the conductive component 151 is electrically connected between the spare electrode 140 and one of the first driving connection wire 113 and the second driving connection wire 114. For example, the vertical projection of the conductive component 151 on the substrate 100 individually overlaps the vertical projection of the driving bump part 123 connected to the first driving connection wire 113 on the substrate 100 and the vertical projection of one of the two second parts of the spare electrode 140 being more adjacent to the first driving connection wire 113 on a substitute 100. In this embodiment, the number of the conductive component 151 is, for example, two, but the present invention is not limited thereto, and the number of the conductive component 151 may be one according to other embodiments.

It should be noted that, in some embodiments, the first secondary light emitting device LEDr1 may also be optionally connected between the first part 141 of the spare electrode 140 and the second connecting wire 112, and the luminous color of the first secondary light emitting device LEDr1 is optionally same with the luminous color of one of the third light emitting device LED3 emitted and the fourth light emitting device LED4. In other words, the first secondary light emitting device LEDr1 may also be configured to replace at least one of the third light emitting device LED3 and the fourth light emitting device LED4 being unable to emit light, which helps to improve the yield of the LED panel 20R.

FIG. 12 is a schematic top view illustrating an unrepaired LED panel 21 according to a fourth embodiment of the disclosure. FIG. 13 is a schematic top view illustrating the repaired LED panel 21R according to a fourth embodiment of the disclosure.

Referring to FIG. 12, the difference between the unrepaired LED panel 21 of the present embodiment and the unrepaired LED panel 20 of FIG. 8 is that the first part 141 of the spare electrode 140B extends in the direction D2, the two second parts 142 individually extend in the direction D1 (i.e., the extension direction of the first connecting wire 111), and the LED panel 21 does not include the connecting bump part 124 shown in FIG. 8.

As can be seen from FIG. 13, the repaired LED panel 21R may also optionally include the first secondary light emitting device LEDr1 and the second secondary light emitting device LEDr2. The first secondary light emitting device LEDr1 is connected between the first connecting wire 111 and the spare electrode 140. The second secondary light emitting device LEDr2 is connected between the second connecting wire 112 and the spare electrode 140B'. Since the first secondary light emitting device LEDr1 and the second secondary light emitting device LEDr2 of the present embodiment are similar to the first secondary light emitting device LEDr1 shown in FIG. 10, the composition structure and type of the first secondary light emitting device LEDr1 and the second secondary light emitting device LEDr2 of the present disclosure are referred to the relative description of the third embodiment, which will not be repeated here.

For example, the luminous color of the first secondary light emitting device LEDr1 and the luminous color of the first light emitting device LED1 may be optionally the same, the luminous color of the second secondary light emitting device LEDr2 and the luminous color of the second light emitting device LED2 may be optionally the same, and the luminous color of the first secondary light emitting device LEDr1 and the luminous color of the second secondary light emitting device LEDr2 may be optionally different, but the present invention is not limited thereto. In this embodiment, the first electrode 131 of the first secondary light emitting device LEDr1 covers and is electrically connected to one of the two second parts 142 of the spare electrode 140B', and the first electrode 131 of the second secondary light emitting device LEDr2 covers and is electrically connected to another of the two second parts 142 of the spare electrode 140B'. The second electrode 132 of the first secondary light emitting device LEDr1 covers and is electrically connected to the first connecting wire 111, and the second electrode 132 of the second secondary light emitting device LEDr2 covers and is electrically connected to the second connecting wire 112. The LED panel 21R may also optionally include two conductive components 151, one of the conductive components 151 is connected between the first driving connection wire 113 and the spare electrode 140B', and another of the conductive component 151 is connected between the second driving connection wire 114 and the spare electrode 140B'.

The repairing process of the LED panel 21 may also optionally include a cutting step so that the first part 141' of the spare electrode 140B' has the disconnecting opening 141c. That is, the first part 141' may be divided into the first sub part 141a and the second sub part 141b. The first sub part 141a and the second sub part 141b are spaced apart from each other by the disconnecting opening 141c, the first sub part 141a is located between the disconnecting opening 141c and one of the two second parts 142, and the second sub part 141b is located between the disconnecting opening 141c and another of the two second parts 142. In this embodiment, the method of cutting step may include laser cutting. It is worth mentioned that the spare electrode 140B' of this embodiment may be configured to individually repair two adjacent light emitting devices when two light emitting devices are unable to emit light, which helps to improve the repair yield of the LED panel 21R.

FIG. 14 is a schematic top view illustrating an unrepaired LED panel 22 according to a fifth embodiment of the disclosure. FIG. 15 is a schematic top view illustrating a repaired LED panel 22R according to a fifth embodiment of the disclosure. Referring to FIG. 14, the difference between the unrepaired LED panel 22 of the present embodiment and the unrepaired LED panel 21 of FIG. 12 is that the first part 141-1 of the spare electrode 140C of the unrepaired LED panel 22 has the disconnecting opening 141c. That is, the first part 141-1 may be divided into the first sub part 141a and the second sub part 141b, the first sub part 141a and the second sub part 141b are spaced apart from each other by the disconnecting opening 141c, the first sub part 141a is located between the disconnecting opening 141c and one of the two second parts 142, and the second sub part 141b is located between the disconnecting opening 141c and another of the two second parts 142.

Referring to FIG. 15, the difference between the repaired LED panel 22R of the present embodiment and the repaired LED panel 21R of FIG. 13 is that the first secondary light emitting device LEDr1 and the second secondary light emitting device LEDr2 of the repaired LED panel 22R are staggered with each other in the direction D2, and the repairing process does not include the forming step of the conductive component 151 and the cutting step of the first part 141-1 of the spare electrode 140C.

In this embodiment, the first electrode 131 of the first secondary light emitting device LEDr1 covers and is electrically connected to the driving bump part 123 connected to the first driving connection wire 113 and the corresponding second part 142, the first electrode 131 of the second secondary light emitting device LEDr2 covers and is electrically connected to the driving bump part 123 connected to the second driving connection wire 114 and the corresponding second part 142. In addition, the first part 141-1 of the spare electrode 140C originally has the disconnecting opening 141c so that the first secondary light emitting device LEDr1 and the second secondary light emitting device LEDr2 are electrically independent from each other without an additional cutting procedure, thereby helping to reduce the repair time and material cost and to improve the repair yield of the LED panel 22R.

Figure 16:
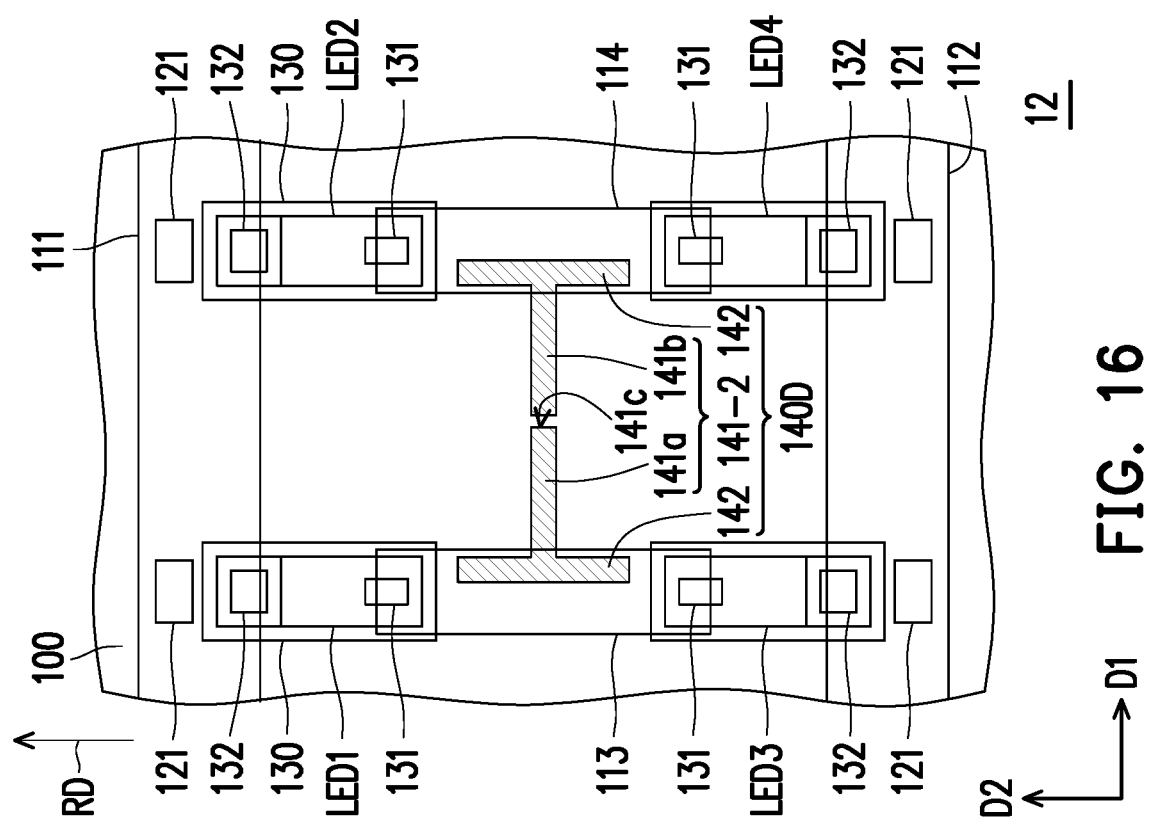
FIG. 16 is a schematic top view illustrating an unrepaired LED panel according to a sixth embodiment of the disclosure.
Figure 17:
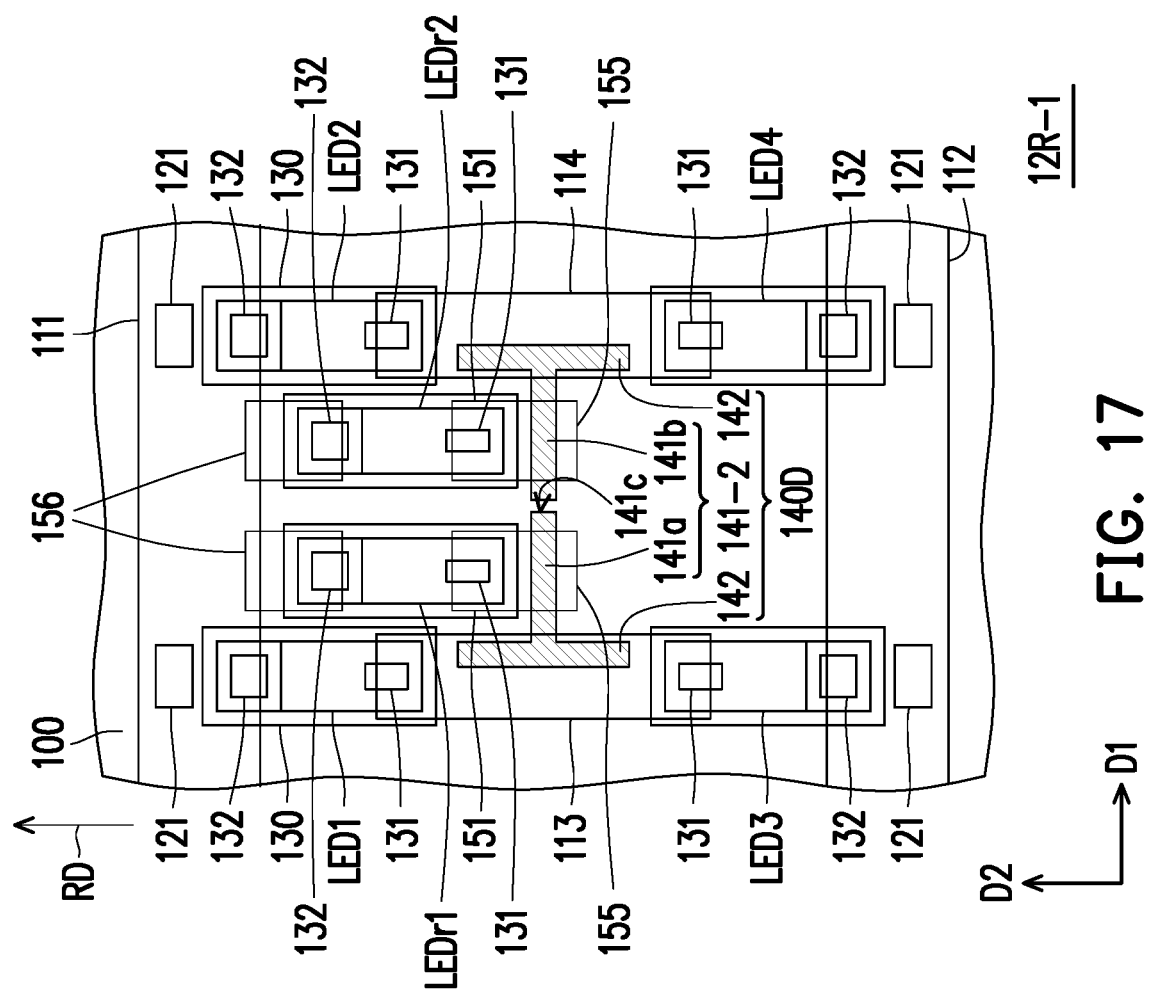
FIG. 17 is a schematic top view illustrating a repaired LED panel according to a sixth embodiment of the disclosure.
Figure 18:
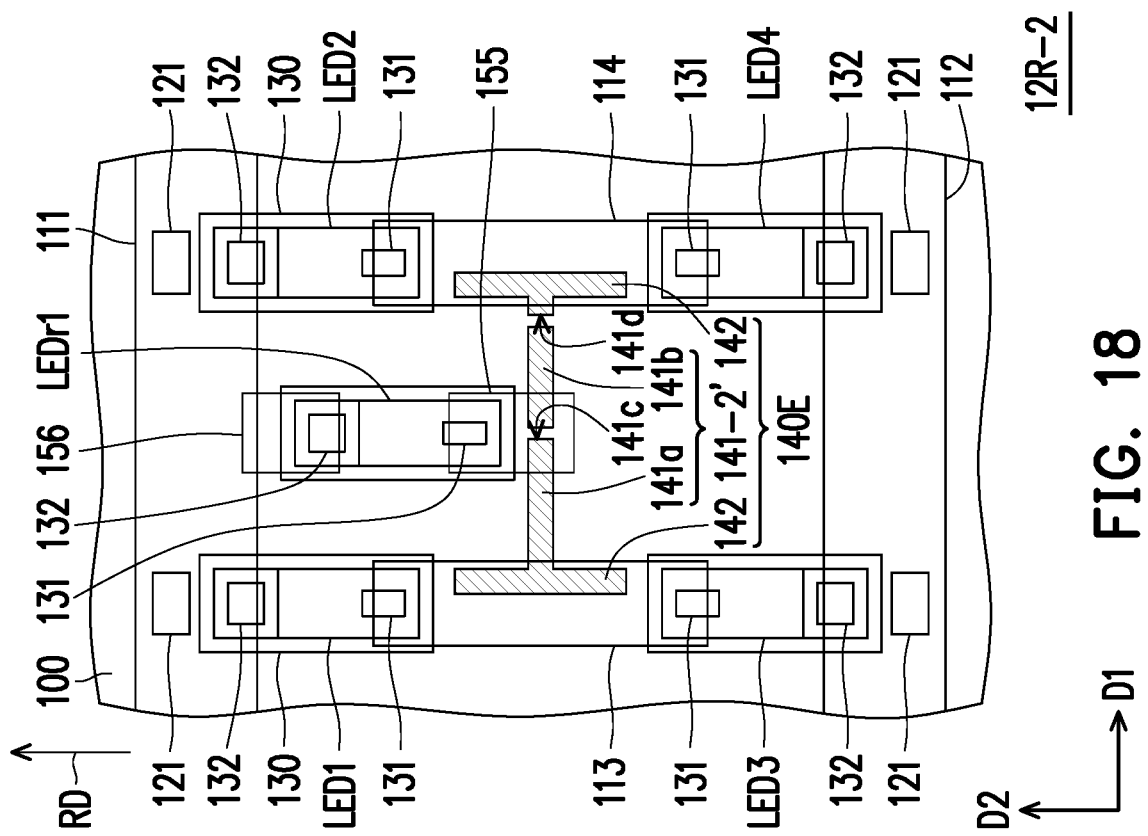
FIG. 18 is a schematic top view illustrating a repaired LED panel by another method according to a sixth embodiment of the disclosure.

FIG. 16 is a schematic top view illustrating the unrepaired LED panel 12 according to a sixth embodiment of the disclosure. FIG. 17 is a schematic top view illustrating the repaired LED panel 12R-1 according to a sixth embodiment of the disclosure. FIG. 18 is a schematic top view illustrating the repaired LED panel 12R-2 by another method according to a sixth embodiment of the disclosure. Referring to FIG. 16, the difference between the unrepaired LED panel 12 of the present embodiment and the unrepaired LED panel 10 of FIG. 1 is that the first part 141-2 of the spare electrode 140D of the unpatched LED panel 12 has the disconnecting opening 141c, and the two second parts 142 of the spare electrode 140D individually overlap the first driving connection wire 113 and the second driving connection wire 114. In addition, the unrepaired LED panel 12 does not include the second connecting pad 122 of FIG. 1.

In detail, the first part 141-2 of the spare electrode 140D may be divided into the first sub part 141a and the second sub part 141b, the first sub part 141a and the second sub part 141b are spaced apart from each other by the disconnecting opening 141c, the first sub part 141a is located between the disconnecting opening 141c and one of the two second parts 142, the second sub part 141b is located between the disconnecting opening 141c and another of the two second parts 142. One of the two second parts 142 of the spare electrode 140D is located between two adjacent first electrodes 131 of the first light emitting device LED1 and the third light emitting device LED3, and another of the two second parts 142 is located between two adjacent first electrodes 131 of the second light emitting device LED2 and fourth light emitting device LED4.

Referring to FIG. 17, the difference between the repaired LED panel 12R-1 of the present embodiment and the repaired LED panel 10R-2 of FIG. 5 is that the repair process of the repaired LED panel 12R-1 need not be included the forming step of the conductive component 151 and the cutting step of the first part 141' of the spare electrode 140 as shown in FIG. 5. In this embodiment, the first driving connection wire 113 covers and is electrically connected to one of the two second parts 142 of the spare electrode 140D being adjacent to the first light emitting device LED1, and the second driving connection wire 114 covers and is electrically connected to another of the two second parts 142 of the spare electrode 140D being adjacent to the second light emitting device LED2. In addition, the disconnecting opening 141c of the first part 141-2 of the spare electrode 140D electrically separates the first secondary light emitting device LEDr1 from the second secondary light emitting device LEDr2 without an additional cutting procedure, thereby helping to reduce the repair time and material cost of the repairing process and improve the repair yield of the LED panel 12R-1.

Referring to FIG. 18, the difference between the repaired LED panel 12R-2 of the present embodiment and the repaired LED panel 12R-1 of FIG. 17 is that the repaired LED panel 12R-2 only includes the first secondary light emitting device LEDr1, and the repairing process of the LED panel 12R-2 may also optionally include the cutting step so that the first part 141-2' of the spare electrode 140E has another disconnecting opening 141d.

For example, the luminous color of the first secondary light emitting device LEDr1 and the luminous color of the first light emitting device LED1 may be optionally the same, and the first spare connection wire 155 electrically connected to the first electrode 131 of the first secondary light emitting device LEDr1 and the spare electrode 140E may optionally cover the disconnecting opening 141c of the first part 141-2', and the disconnecting opening 141d of the first part 141-2' is located between the first spare connection wire 155 and the second driving connection wire 114, but the present invention is not limited thereto. In some embodiments, the luminous colors of the first secondary light emitting device LEDr1 and the second light emitting device LED2 may be optionally the same, and the disconnecting opening 141d of the first part 141-2' is located between the first spare connection wire 155 and the first driving connection wire 113, thereby helping to increase the layout space of the light emitting device configured for repairing and improve the repair yield of the LED panel 12R-2.

FIG. 19 is a schematic top view illustrating an unrepaired LED panel 23 according to a seventh embodiment of the disclosure. FIG. 20 is a schematic top view illustrating a repaired LED panel 23R according to a seventh embodiment of the disclosure. Referring to FIG. 19, the LED panel 23 includes the first connecting wire 111, the first driving connection wire 113, the second driving connection wire 114, a spare electrode 140F, the first light emitting device LED1, and the second light emitting device LED2, and the LED panel 23 also optionally includes the second connecting wire 112, the third light emitting device LED 3, and the fourth light emitting device LED 4. The first connecting wire 111, the second connecting wire 112, the first driving connection wire 113, the second driving connection wire 114, the spare electrode 140F, the first light emitting device LED1, the second light emitting device LED2, the third light emitting device LED3 and the fourth light emitting device LED4 of the LED panel 23 are similar to the above components of the LED panel 20 of FIG. 8. Therefore, the relative arrangement relationship and the material composition of the above components of the present disclosure are referred to the relevant description of the third embodiment, and will not be repeated here.

In this embodiment, the spare electrode 140F of the LED panel 23 may also optionally include four bump parts 143, which individually extend from the opposite ends of the two second parts 142 along the direction D1 toward one of the first driving connection wire 113 and the second driving connection wires 114 being more adjacent to each of the four bump parts 143 and connected to one of the first driving connection wire 113 and the second driving connection wire 114 being more adjacent to each of the four bump parts 143. In addition, the first part 141-3 of the spare electrode 140F of the LED panel 23 has a disconnecting opening 141c. Specifically, the first part 141-3 of the spare electrode 140F may be divided into the first sub part 141a and the second sub part 141b, the first sub part 141a and the second sub part 141b are spaced apart from each other by the disconnecting opening 141c, the first sub part 141a is located between the disconnecting opening 141c and one of the two second parts 142, and the second sub part 141b is located between the disconnecting opening 141c and another of the two second parts 142.

As can be seen from FIG. 20, the repaired LED panel 23R further includes the first secondary light emitting device LEDr1 which is connected between the first connecting wire 111 and the spare electrode 140F'. Since the first secondary light emitting device LEDr1 of this embodiment is similar to the first secondary light emitting device LEDr1 shown in FIG. 11, the structure composition and type of the first secondary light emitting device LEDr1 of this embodiment are referred to the relevant description of the third embodiment, and this will not be repeated. For instance, the luminous colors of the first secondary light emitting device LEDr1 and the first light emitting device LED1 may be optionally the same, but the present invention is not limited thereto.

In this embodiment, the first electrode 131 of the first secondary light emitting device LEDr1 may optionally cover the disconnecting opening 141c of the first part 141-3', and the first electrode 131 of the first secondary light emitting device LEDr1 is electrically connected between the first sub part 141a and the second sub part 141b. In particular, the repairing process of the LED panel 23R may optionally include the cutting step so that the first part 141-3' of the spare electrode 140F' has another disconnecting opening 141d, and the first part 141-3' and the two second parts 142 connected to the second driving connection wire 114 are spaced apart by the disconnecting opening 141d. However, the present invention is not limited thereto, and according to other embodiments, the luminous colors of the first secondary light emitting device LEDr1 and the second light emitting device LED2 may be optionally the same, and the first part 141-3' and the two second parts 142 connected to the first driving connection wire 113 are spaced apart by the disconnecting opening 141d. In this way, the layout space of the light emitting device for repairing can be increased, which helps to improve the repair yield of the LED panel 23R.

FIG. 21 is a schematic top view illustrating an unrepaired LED panel 24 according to an eighth embodiment of the disclosure. FIG. 22 is a schematic top view illustrating a repaired LED panel 24R according to an eighth embodiment of the disclosure.

Referring to FIG. 21, the difference between the unmodified LED panel 24 of the present embodiment and the unrepaired LED panel 23 of FIG. 19 is that the oriented direction of each of the first light emitting device LED1, the second light emitting device LED2, the third light emitting device LED3 and the fourth light emitting device LED4 of the LED panel 24 is not parallel to the arranged direction of the first light emitting device LED1 and the third light emitting device LED3 (i.e., the row direction RD). Specifically, the vertical projections of the four first electrodes 131 of the first light emitting device LED1, the second light emitting device LED2, the third light emitting device LED3, and the fourth light emitting device LED4 on the substrate 100 individually overlap the vertical projection of the four bump parts 143 of the spare electrode 140F on the substrate 100.

As can be seen from FIG. 22, the difference between the repaired LED panel 24R of the present embodiment and the repaired LED panel 23R of FIG. 20 is that the repaired LED panel 24R can also optionally include the second secondary light emitting device LEDr2, and the oriented direction of each of the first secondary light emitting device LEDr1, the second secondary light emitting device LEDr2 and the first light emitting device LED1 may be optionally the same. In addition, the repairing process of the LED panel 24R does not need to include the cutting step of the first part 141-3 of the spare electrode 140F.

The luminous colors of the first secondary light emitting device LEDr1 and the second secondary light emitting device LEDr2 may be optionally different, the luminous colors of the first secondary light emitting device LEDr1 and the first light emitting device LED1 may be optionally the same, and the luminous colors of the second secondary light emitting device LEDr2 and the second light emitting device LED2 can be optionally the same, but the present invention is not limited thereto. In this embodiment, the first electrode 131 of the first secondary light emitting device LEDr1 covers the second part 142 connected to the first sub part 141a, and the first electrode 131 of the first secondary light emitting device LEDr1 is electrically connected to the first sub part 141a. The first electrode 131 of the second secondary light emitting device LEDr2 covers the second part 142 connected to the second sub part 141b, and the first electrode 131 of the second secondary light emitting device LEDr2 is electrically connected to the second sub part 141b. In particular, the disconnecting opening 141c of the first part 141-3 of the spare electrode 140F electrically separates the first secondary light emitting device LEDr1 and the second secondary light emitting device LEDr2 from each other. In this way, the repair requirement of two light emitting devices individually arranged in two adjacent rows and are unable to emit light may be satisfied, and the layout space of the light emitting device configured for repairing is increased, which helps to improve the repair yield of the LED panel 24R.

In summary, in the LED panel of the embodiment of the present invention, the repair time and material cost can be reduced so as to improve the repair yield of the LED panel by the spare electrode disposed between the first driving connection wire and the second driving connection wire having the first part and the second part, wherein the extension directions of the first part and the second part are intersected with each other.

Although the present invention has been exposed as above, it is not intended to limit the present invention, and any person with ordinary knowledge in the technical field may make some changes and refinements without departing from the spirit and scope of the present invention. The scope of protection of invention is subject to the definition of the scope of the patent application.

It will be clear that various modifications and variations can be made to the disclosure. It is intended that the specification and examples are considered as exemplary embodiments only, with a scope of the disclosure being indicated by the following claims and their equivalents.

What is claimed is:

1. A LED panel, comprising:
a first connecting wire;
a first driving connection wire;
a second driving connection wire, wherein both the first driving connection wire and the second driving connection wire are located on the same side of the first connecting wire, wherein a driving signal transmitted by the first driving connection wire is independent of a driving signal transmitted by the second driving connection wire;
a first light emitting device connected between the first connecting wire and the first driving connection wire;
a second light emitting device connected between the first connecting wire and the second driving connection wire; and
a spare electrode located between the first driving connection wire and the second driving connection wire, and the spare electrode comprising:
a first part and two second parts, wherein the first part is located between the two second parts and extends in a first direction, each of the two second parts extends in a second direction, and an imaginary line extended from the first part along the first direction crosses over the two second parts.

2. The LED panel according to claim 1, wherein the first direction is parallel to an extension direction of the first connecting wire.

3. The LED panel according to claim 1, wherein the two second parts of the spare electrode neither overlap the first driving connection wire nor overlap the second driving connection wire.

4. The LED panel according to claim 3, wherein the first part continuously extends between the two second parts, and the opposite two ends of the first part are individually connected to the two second parts.

5. The LED panel according to claim 4, wherein the spare electrode further comprises a bump part which extends from an end of one of the two second parts, wherein the bump part extends along the first direction away from the first part and is separated from one of the first driving connection wire and the second driving connection wire being more adjacent to the bump part with a spacing.

6. The LED panel according to claim 4, further comprising a driving bump part which overlaps one of the first driving connection wire and the second driving connection wire, wherein the driving bump part protrudes toward the spare electrode along the first direction and is separated from the spare electrode with a spacing.

7. The LED panel according to claim 4, further comprising a conductive component which electrically connects one of the two second parts of the spare electrode to one of the first driving connection wire and the second driving connection wire being more adjacent to the one of the two second parts.

8. The LED panel according to claim 7, further comprising a first secondary light emitting device, wherein one end of the first secondary light emitting device is electrically connected to the first connecting wire, and another end of the first secondary light emitting device is electrically connected to the first part.

9. The LED panel according to claim 8, further comprising a spare connection wire which electrically connects the first secondary light emitting device to the first part.

10. The LED panel according to claim 3, wherein the second direction is parallel to the extension direction of the first connecting wire.

11. The LED panel according to claim 10, further comprising a driving bump part which overlaps one of the first driving connection wire and the second driving connection wire, wherein the driving bump part protrudes toward the spare electrode along the first direction and is separated from the spare electrode with a spacing.

12. The LED panel according to claim 11, further comprising a first secondary light emitting device, wherein one end of the first secondary light emitting device is electrically connected to the first connecting wire, another end of the first secondary light emitting device covers and is electrically connected to the driving bump part and the corresponding one of the two second parts.

13. The LED panel according to claim 1, wherein the first part is divided into a first sub part and a second sub part, the first sub part and the second sub part are separated from each other by a disconnecting opening, the first sub part is located between the disconnecting opening and one of the two second parts, and the second sub part is located between the disconnecting opening and the other of the two second parts.

14. The LED panel according to claim 13, further comprising a first secondary light emitting device and a second secondary light emitting device, wherein the first secondary light emitting device and the second secondary light emitting device are individually electrically connected to the first sub part and the second sub part.

15. The LED panel according to claim 14, wherein the first secondary light emitting device is electrically connected to the first driving connection wire via the spare electrode, the second secondary light emitting device is electrically connected to the second driving connection wire via spare electrode, and the first secondary light emitting device and the second secondary light emitting devices are electrically independent with each other via the disconnecting opening.

16. The LED panel according to claim 15, further comprising:
a second connecting wire;
a third light emitting device connected between the second connecting wire and the first driving connection wire;
a fourth light emitting device connected between the second connecting wire and the second driving connection wire, wherein the first light emitting device and the third light emitting device are arranged in one row between the first connecting wire and the second connecting wire, and the second light emitting device and the fourth light emitting device are arranged in another row between the first connecting wire and the second connecting wire,
wherein the first secondary light emitting device and the second secondary light emitting device are individually electrically connected to the first connecting wire and the second connecting wire.

17. The LED panel according to claim 15, wherein both the first secondary light emitting device and the second secondary light emitting device are electrically connected to the first connecting wire.

18. The LED panel according to claim 13, wherein the spare electrode further comprises a bump part which extends from an end of one of the two second parts toward one of the first driving connection wire and the second driving connection wire being more adjacent to the bump part and overlaps with one of the first driving connection wire and the second driving connection wire being more adjacent to the bump part.

19. The LED panel according to claim 18, further comprising a first secondary light emitting device, wherein one end of the first secondary light emitting device is electrically connected to the first connecting wire, and another end of the first secondary light emitting device overlaps the disconnecting opening and is electrically connected to the first sub part and the second sub part, wherein the first part is separated from one of the two second parts by another disconnecting opening.

20. The LED panel according to claim 1, wherein the spare electrode and the first connecting wire are composed of the same conductive layer.

21. The LED panel according to claim 1, wherein the first light emitting device and the second light emitting device individually comprise a first electrode, a second electrode, a first semiconductor layer, a second semiconductor layer and a light emitting layer, wherein the light emitting layer is located between the first semiconductor layer and the second semiconductor layer, and the first electrode and the second electrode are located on the same side of the second semiconductor layer.

22. The LED panel according to claim 1, wherein the luminous color of the first light emitting device is different from the luminous color of the second light emitting device.

23. The LED panel according to claim 22, further comprising:
a second connecting wire;
a third light emitting device connected between the second connecting wire and the first driving connection wire;
a fourth light emitting device connected between the second connecting wire and the second driving connection wire, the first light emitting device and the third light emitting device are arranged in one row along a row direction between the first connecting wire and the second connecting wire, and the second light emitting device and the fourth light emitting device are arranged in another row along the row direction between the first connecting wire and the second connecting wire,
wherein the luminous color of the first light emitting device is the same with the luminous color of the third light emitting device, and the luminous color of the second light emitting device is the same with the luminous color of the fourth light emitting device.

24. The LED panel according to claim 23, wherein an oriented direction of each of the first light emitting device, the second light emitting device, the third light emitting device, and the fourth light emitting device is a third direction, and a non-right angle is included between the third direction and the row direction.

25. The LED panel according to claim 23, wherein the row direction is intersected with the extension direction of the first connecting wire.

\* \* \* \* \*